(12) United States Patent
Hamada et al.

(10) Patent No.: US 8,780,438 B2
(45) Date of Patent: *Jul. 15, 2014

(54) WAVELENGTH CONVERSION ELEMENT INCLUDING PHOSPHOR PARTICLES, AND LED ELEMENT AND SEMICONDUCTOR LASER LIGHT EMITTING DEVICE USING WAVELENGTH CONVERSION ELEMENT

(71) Applicant: Panasonic Corporation, Osaka (JP)

(72) Inventors: Takahiro Hamada, Osaka (JP); Nobuyasu Suzuki, Osaka (JP); Kenji Orita, Osaka (JP); Nobuaki Nagao, Gifu (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/080,500

(22) Filed: Nov. 14, 2013

(65) Prior Publication Data

US 2014/0072812 A1   Mar. 13, 2014

Related U.S. Application Data

(63) Continuation of application No. PCT/JP2013/003237, filed on May 21, 2013.

(30) Foreign Application Priority Data

May 22, 2012  (JP) .................................. 2012-116189

(51) Int. Cl.
*F21K 99/00*    (2010.01)
*H01L 33/50*    (2010.01)

(52) U.S. Cl.
USPC .............................. 359/326; 257/98; 362/259

(58) Field of Classification Search
USPC ...................... 359/326–332; 362/259; 257/98
See application file for complete search history.

(56) References Cited

U.S. PATENT DOCUMENTS

| | | | |
|---|---|---|---|
| 4,959,262 A * | 9/1990 | Charles et al. ................ | 428/329 |
| 5,998,925 A | 12/1999 | Shimizu et al. | |
| 2009/0173957 A1 * | 7/2009 | Brunner et al. ................. | 257/98 |
| 2010/0283076 A1 | 11/2010 | Winkler et al. | |
| 2012/0098015 A1 * | 4/2012 | Krauter ........................... | 257/98 |
| 2014/0007921 A1 * | 1/2014 | Kuramachi ................... | 136/247 |

FOREIGN PATENT DOCUMENTS

| | | | |
|---|---|---|---|
| JP | 04-338735 A | 11/1992 | |
| JP | 2004-186488 A | 7/2004 | |
| JP | 2004-315342 A | 11/2004 | |

(Continued)

OTHER PUBLICATIONS

International Search Report for corresponding International Application No. PCT/JP2013/003237, mailed Jul. 9, 2013.

(Continued)

*Primary Examiner* — Daniel Petkovsek
(74) *Attorney, Agent, or Firm* — Renner, Otto, Boisselle & Sklar, LLP

(57) ABSTRACT

A wavelength conversion element includes: a plurality of phosphor particles; a first matrix located among a part of the plurality of phosphor particles and formed of zinc oxide in a c-axis orientation; and a second matrix located among a remaining part of the plurality of phosphor particles and formed of a material having a refractive index that is lower than a refractive index of the zinc oxide.

20 Claims, 16 Drawing Sheets

(56) References Cited

FOREIGN PATENT DOCUMENTS

| | | |
|---|---|---|
| JP | 2007-046002 A | 2/2007 |
| JP | 2008-066365 A | 3/2008 |
| JP | 2008-235744 A | 10/2008 |
| JP | 2009-096653 A | 5/2009 |
| JP | 2009-105125 A | 5/2009 |
| JP | 2009-231569 A | 10/2009 |
| JP | 2011-503266 T | 1/2011 |
| JP | 2011-053323 A | 3/2011 |
| JP | 2011-111506 A | 6/2011 |
| JP | 2011-168627 A | 9/2011 |
| JP | 2011-180353 A | 9/2011 |
| JP | 2012-059893 A | 3/2012 |
| WO | 2010/140417 A1 | 12/2010 |

OTHER PUBLICATIONS

Written Opinion for corresponding International Application No. PCT/JP2013/003237, dated Jul. 9, 2013.

Mingsong Wang et. al., "Influence of annealing temperature on the structural and optical properties of sol-gel prepared ZnO thin films" Phys. Stat. Sol. (a) 203/10 (2006) 2418-242.

Hiroyo Segawa et. al., "Fabrication of glasses of dispersed yellow oxynitride phosphor for white light-emitting diodes" Opt. Mater. 33(2010) 170-175.

Jeong Rok Oh et. al., "Enhanced forward efficiency of $Y_3Al_5O_{12}:Ce^{3+}$ phosphor from white light-emitting diodes using blue-pass yellow-reflection filter" Optics Express, vol. 17, Issue 9, pp. 7450-7457 (2009).

Co-pending U.S. Appl. No. 14/070,882, filed Nov. 4, 2013.

* cited by examiner

GLASS SUBSTRATE | ZnO THIN FILM | ZnO (c-AXIS ORIENTATION) | PHOSPHOR | TRACE IN WHICH PHOSPHOR WAS EMBEDDED

PHOSPHOR LAYER NOT FILLED WITH ZnO

FIRST PHOSPHOR LAYER

TRACE IN WHICH PHOSPHOR WAS EMBEDDED

PHOSPHOR

SINGLE CRYSTALLINE ZnO

WAVELENGTH CONVERSION ELEMENT INCLUDING PHOSPHOR PARTICLES, AND LED ELEMENT AND SEMICONDUCTOR LASER LIGHT EMITTING DEVICE USING WAVELENGTH CONVERSION ELEMENT

This is a continuation of International Application No. PCT/JP2013/003237, with an international filing date of May 21, 2013, which claims priority of Japanese Patent Application No. 2012-116189, filed on May 22, 2012, the contents of which are hereby incorporated by reference.

BACKGROUND

1. Technical Field

The present application relates to a wavelength conversion element including phosphor particles and a method of manufacturing the same, and an LED element and a semiconductor laser light emitting device using the same.

2. Description of the Related Art

Conventionally, as a white LED element, a type which uses a gallium nitride (GaN)-based LED chip which emits blue light and a wavelength conversion element which is formed of a yttrium aluminum garnet (YAG) phosphor that is excited by blue light from the LED chip to emit yellow light and of a light-transmitting resin formed of a silicone resin or the like is widely known. Such a white LED element emits white light through mixture of blue light from the LED chip and yellow light emitted from the phosphor which is excited by the blue light.

In order to manufacture white LED elements having uniform chromaticity, it is necessary to cause the ratio between blue light from the LED chip and yellow light emitted from the phosphor to be constant. However, light emission nonuniformity of blue light due to LED chips is sometimes difficult to avoid in manufacturing. Therefore, it is thought that, by adjusting the wavelength conversion element in accordance with the light emission nonuniformity of blue light from the LED chip, the chromaticity of white light from the LED elements is caused to be constant.

Japanese Patent Application Laid-Open Publication No. 2004-186488 discloses a method in which, by, after a light-transmitting resin is cured, grinding a part of the light-transmitting resin layer which does not include phosphor particles until the white LED element has a target chromaticity, the path of a light beam from the LED chip is changed to adjust the chromaticity of the LED element.

Japanese Patent Application Laid-Open Publication No. 2009-231569 discloses a method of adjusting the chromaticity of a white LED element which enables adjustment of the chromaticity in various directions in chromaticity coordinates by selecting, as a second phosphor, a phosphor which has a light emission wavelength that is different from the light emission wavelength of a first phosphor and adjusting the added amount and the location of the second phosphor with respect to the light-transmitting resin.

Japanese Patent Application Laid-Open Publication No. 2009-96653 describes a problem that, when a large current is passed through the LED element in order to obtain high brightness, light and heat from the LED chip deteriorate with time the light-transmitting resin of the wavelength conversion element to lower the transmittance, and thus, the amount of light output from the white LED element is reduced, and a problem that the balance between light emitted from the LED chip and light emitted from the phosphor is lost to shift the chromaticity of the white LED element.

Japanese Patent Application Laid-Open Publication No. 2009-96653 proposes a method including, for the purpose of using glass which is excellent in resistance to heat and resistance to ultraviolet radiation as a matrix in the wavelength conversion element, a step of molding into a molded body a powder mixture of phosphor particles and glass powder, a sintering step of sintering the molded body to form a sintered body, an HIP step of processing the sintered body by hot isostatic pressing (HIP), and a processing step of processing, after the HIP step, the sintered body to obtain the wavelength conversion element. The sintering is carried out at a temperature at which a reaction between the phosphor and the glass, coloring of the glass, and the like do not occur. In the HIP step, the hot isostatic pressing is carried out at a temperature which is equal to or higher than the glass transition temperature of the glass and which is equal to or lower than the sintering temperature. With regard to the wavelength conversion element obtained in this way, the extent of reduction in light emission efficiency of the phosphor is small, and air bubble does not remain therein and the glass thereof is not colored.

In Japanese Patent Application Laid-Open Publication No. 2011-168627 (in particular, paragraphs 0028, and 0197 and 0198), after a phosphor particle layer is formed on a substrate from a solution in which phosphor particles are dispersed using electrophoresis, a light-transmitting substance to be an inorganic substance matrix is filled in spaces in the phosphor particle layer using a sol-gel method. Further, it is disclosed that the light-transmitting substance is preferably glass, and is a substance which is in a glass state and transmits light.

Japanese Patent Application Laid-Open Publication No. 2008-66365 (in particular, paragraph 0003) discloses that, when a cavity in which a light-transmitting material to be a matrix do not exist is caused in a wavelength conversion element, the existence of such a cavity attenuates light from the LED and light from the phosphor.

Japanese Patent Translation Publication No. 2011-503266 (in particular, paragraph 0002) discloses that, in an LED, ordinarily, a phosphor is embedded in a silicone resin having a refractive index of 1.4 to form a wavelength conversion element, and thus, due to the refractive index difference (0.4) between the refractive index (1.8) of the phosphor and the refractive index (1.4) of the silicone resin, a considerable ratio of light is scattered at an interface between the phosphor and the resin in the wavelength conversion element.

Further, Japanese Patent Application Laid-Open Publication No. 2011-168627 (in particular, paragraphs 0028, and 0197 and 0198) and Japanese Patent Application Laid-Open Publication No. 2011-111506 (in particular, paragraph 0027) describe that the refractive index of a phosphor which is generally used for an LED is in a range of 1.8 to 2.0. The refractive index of an yttrium aluminum garnet (YAG) phosphor is 1.8 (Japanese Patent Application Laid-Open Publication No. 2011-168627), the refractive index of a SiAlON phosphor is 1.9 (Japanese Patent Application Laid-Open Publication No. 2011-168627), and the refractive index of a $CaAlSiN_3$ phosphor is 2.0 (Japanese Patent Application Laid-Open Publication No. 2011-111506).

SUMMARY

In an LED element or the like including a conventional wavelength conversion element, it is sometimes required to be able to adjust the chromaticity of emitted light with more ease. Non-limiting and exemplary embodiments of the present application provide a wavelength conversion element which can adjust the chromaticity thereof, a method of manufacturing the same, and an LED element and a semiconductor laser light emitting device using the same.

A wavelength conversion element according to one embodiment of the present application includes a plurality of phosphor particles, a first matrix that is located among a part of the plurality of phosphor particles and is formed of zinc oxide in a c-axis orientation, and a second matrix that is located among a remaining part of the plurality of phosphor particles and is formed of a material having a refractive index that is lower than a refractive index of the zinc oxide.

According to a technique disclosed in the present application, the first matrix in a first phosphor layer is formed of crystalline zinc oxide and the second matrix in a second phosphor layer is formed of the material having a refractive index which is lower than that of zinc oxide, and thus, by adjusting the thickness ratio between the first phosphor layer and the second phosphor layer, the chromaticity of the wavelength conversion element can be adjusted.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 17A shows a first phosphor layer in Example 6, and FIG. 17B shows the first phosphor layer in Example 1.

FIG. 18A illustrates a case in which the tilt of the c-axis of zinc oxide in the first phosphor layer is large, and FIG. 18B illustrates a case in which the tilt of the c-axis of zinc oxide in the first phosphor layer is small.

FIG. 25A is an enlarged graph around excitation light from semiconductor laser chips, and FIG. 25B is an enlarged graph around fluorescence excited by excitation light.

FIG. 26A is an enlarged graph around excitation light from semiconductor laser chips, and FIG. 26B is an enlarged graph around fluorescence excited by excitation light.

DETAILED DESCRIPTION

Figure 1:
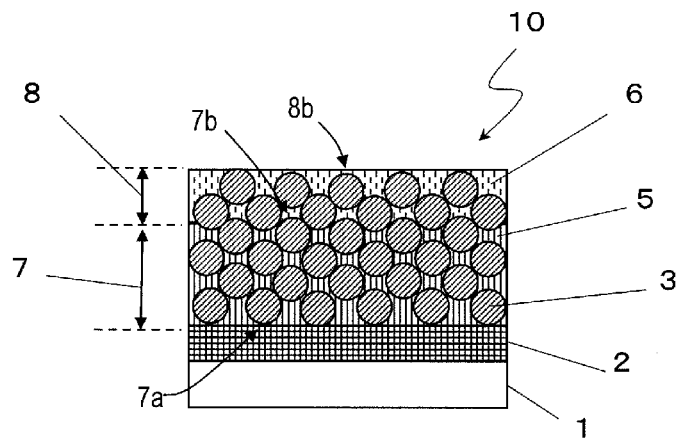
FIG. 1 is a sectional view of a wavelength conversion element in Embodiment 1.

First, problems found by the inventors of the present application are described in detail.

When a light-transmitting resin such as a silicone resin is used as a matrix in a wavelength conversion element, the chromaticity of an LED element is adjusted with ease, and, by a method described in Japanese Patent Application Laid-Open Publication No. 2004-186488 or Japanese Patent Application Laid-Open Publication No. 2009-231569, the chromaticity of a white LED element can be adjusted. However, in a wavelength conversion element using a light-transmitting resin such as a silicone resin, as described in Japanese Patent Application Laid-Open Publication No. 2009-96653, when a large current is passed through a white LED element in order to obtain high brightness, ultraviolet radiation and heat from the LED chip deteriorate with time the light-transmitting resin of the wavelength conversion element to lower the transmittance of the light-transmitting resin. Therefore, the amount of light output from the LED element is reduced. Further, the balance between light emitted from the LED chip and light emitted from the phosphor is lost to shift the chromaticity of the LED element.

In order to realize a wavelength conversion element which is excellent in resistance to heat and resistance to ultraviolet radiation, a method has been proposed in which, as the matrix for forming the wavelength conversion element, a matrix using not an organic substance such as a silicone resin having low resistance to heat and low resistance to ultraviolet radiation but glass as an inorganic substance having high resistance to heat and high resistance to ultraviolet radiation is used (see, for example, Japanese Patent Application Laid-Open Publication No. 2009-96653). However, unlike a silicone resin which is soft and has the large amount of deformation, glass is hard and has the small amount of deformation. Therefore, when, as in Japanese Patent Application Laid-Open Publication No. 2004-186488, in order to reduce the thickness of the wavelength conversion element, the wavelength conversion element is ground, a crack is liable to occur in a wavelength conversion element using glass. Further, when a silicone resin is used, fine adjustment to the amount of the phosphor can be made with ease in a simple formation process. However, when, as in Japanese Patent Application Laid-Open Publication No. 2009-96653, glass is used as the matrix in the wavelength conversion element, a complicated formation process is necessary and fine adjustment to the amount of the phosphor is difficult. Therefore, it is difficult to form the second wavelength conversion element for adjusting the chromaticity after the first wavelength conversion element is formed as in Japanese Patent Application Laid-Open Publication No. 2009-231569.

In Japanese Patent Application Laid-Open Publication No. 2011-168627 (in particular, paragraphs 0028, and 0197 to 0198), after a phosphor particle layer is formed on a substrate from a solution in which phosphor particles are dispersed using electrophoresis, a glass to be an inorganic substance matrix is filled in spaces in the phosphor particle layer using a sol-gel method. Air (refractive index 1.0) exists in the wavelength conversion element before being filled with glass. Glass (refractive index 1.45) exists, instead of air (refractive index 1.0), in the wavelength conversion element after being filled with glass. Japanese Patent Application Laid-Open Publication No. 2011-168627 (in particular, paragraphs 0028, and 0197 to 0198) describes that the chromaticity of the wavelength conversion element is not changed by filling the spaces among the phosphor particles with glass (paragraphs 0197 and 0198). This is thought to be because the difference between the refractive index of glass (1.45) and the refractive index of air (1.0) is small. Further, the manufacturing method according to Japanese Patent Application Laid-Open Publication No. 2011-168627 (in particular, paragraphs 0028, and 0197 to 0198) has a problem that, glass has insulation properties, and thus, after the first phosphor layer is formed, the second phosphor layer for adjusting the chromaticity cannot be formed by electrophoresis.

Glass is in a glass state (amorphous), and thus, has no grain boundary and has a high degree of freedom in shape. Therefore, when glass is used as an inorganic matrix, light scattering due to a grain boundary in the inorganic matrix in the wavelength conversion element is not caused, and formation of a cavity (hereinafter referred to as void) in the wavelength conversion element can be inhibited. However, when, as an inorganic matrix, zinc oxide (ZnO) having a refractive index (2.0) which is higher than that of glass (refractive index 1.45) is applied, zinc oxide is crystalline, and thus, a grain boundary is formed. For example, zinc oxide formed by a sol-gel method is an aggregation of microcrystals, and a polycrystal having random orientations (see, for example, Mingsong Wang et. al., Phys. Stat. Sol. (a) 203/10 (2006) 2418). When a polycrystal having random orientations is formed in the wavelength conversion element, a large number of grain boundaries exist in the direction of light emission, and thus, light scattering is caused in the wavelength conversion element. When the light scattering in the wavelength conversion element is caused, light scattered in the wavelength conversion element returns to the LED chip, to a package for fixing the LED chip, and the like to be absorbed therein, which causes a big problem that the ratio of light taken outside from the LED element is reduced.

Further, when a void remains in the wavelength conversion element, air having a refractive index of as low as 1.0 exists in the void. The refractive index of air (1.0) in the void is significantly different from the refractive index of a phosphor which is ordinarily used for an LED (1.8 to 2.0) and the refractive index of the silicone resin (1.4). Therefore, there is also a problem that, due to the refractive index difference between the void and the phosphor and the refractive index difference between the void and the matrix, light is scattered in the wavelength conversion element.

Further, there is known a method of forming zinc oxide by vacuum deposition such as electron beam deposition, reactive plasma deposition, sputtering, or pulse laser deposition. However, when, for the purpose of forming the wavelength conversion element using the phosphor particles, a film of zinc oxide is formed by vacuum deposition after the phosphor particle layer is formed, zinc oxide is deposited above the phosphor particle layer, and it is difficult to fill a space in the phosphor particle layer with zinc oxide.

In other words, an LED element using as the matrix in the wavelength conversion element an inorganic matrix such as glass which has high resistance to heat and high resistance to ultraviolet radiation has two big problems. One of the problems is that, it is difficult to adjust the color of light emitted from the wavelength conversion element in accordance with the nonuniformity of blue light emitted from the LED chip. The other problem is that, when, in order to adjust the chromaticity, zinc oxide (refractive index 2.0) having a refractive index which is higher than that of glass (refractive index 1.45) is applied as the matrix in the wavelength conversion element, zinc oxide has a low degree of freedom in shape and is crystalline, and thus, a grain boundary and a void are liable to be formed in the wavelength conversion element.

In view of those problems, the inventors of the present application have arrived at a novel wavelength conversion element, a method of manufacturing the same, and an LED element and a semiconductor laser device using the wavelength conversion element. A wavelength conversion element according to one embodiment of the present invention includes, as matrices of the wavelength conversion element using phosphor particles, a first phosphor layer using zinc oxide which is an inorganic material having high resistance to heat and high resistance to ultraviolet radiation and a second phosphor layer using a material having a refractive index that is lower than that of zinc oxide. In the first phosphor layer using zinc oxide, which has a high refractive index but is crystalline and has a low degree of freedom in shape, formation of a grain boundary and a void in the wavelength conversion element are inhibited by solution growth of zinc oxide. Further, by controlling the ratio between the thickness of the first phosphor layer and the thickness of the second phosphor layer, the chromaticity of light emitted from the wavelength conversion element is adjusted and light scattering in the wavelength conversion element is inhibited. All of the chromaticity of the wavelength conversion element, the chromaticity of the LED element, and the chromaticity of the semiconductor laser light emitting device mean the chromaticity of light emitted therefrom. In this way, there are provided a wavelength conversion element in which the chromaticity of light emitted therefrom can be adjusted with ease and light scattering is small, a method of manufacturing the same, and an LED element and a semiconductor laser light emitting device which use the wavelength conversion element to adjust the chromaticity thereof with ease, and which have high optical output.

According to one embodiment of the present invention, the first phosphor layer includes a structure in which a thin film of zinc oxide is formed on a substrate, a phosphor particle layer formed of phosphor particles is formed on the thin film of zinc oxide, and a space in the phosphor particle layer is filled with zinc oxide which is crystal grown in a c-axis orientation from the thin film of zinc oxide.

Zinc oxide has a crystal structure of the wurtzite type. Zinc oxide in the c-axis orientation means that a plane thereof which is in parallel with the substrate is a c-plane. Further, according to the present disclosure, a substrate includes not only a so-called substrate such as a glass substrate, a sapphire substrate, and a gallium nitride (GaN) substrate but also a semiconductor light emitting element, a substrate of a semiconductor light emitting element, a surface of a thin film formed thereon, a principal plane of the phosphor layer, and the like.

Zinc oxide which is grown in the c-axis orientation becomes columnar crystals, and the number of the grain boundaries in the c-axis direction is small. Further, zinc oxide crystals grow in the c-axis direction from the thin film of zinc oxide in the c-axis orientation formed on the substrate, and thus, columnar crystals with only a small number of grain boundaries can be arranged in a direction of light exiting from the LED chip. Therefore, light scattering in the first phosphor layer can be inhibited. The columnar crystals in the c-axis orientation mean that the growth rate of zinc oxide in the c-axis direction is faster than growth rate of zinc oxide in an a-axis direction and zinc oxide crystallites which are lengthwise long are formed with respect to the substrate. A crystallite means a minimum region which can be regarded as a single crystal in a polycrystal.

By using a thin film of single crystalline zinc oxide which is epitaxially grown as the thin film of zinc oxide, a space among the phosphor particles can be filled with single crystalline zinc oxide which is epitaxially grown from the thin film of zinc oxide. Single crystalline zinc oxide which is epitaxially grown has only a significantly small number of grain boundaries, and thus, light scattering due to grain boundaries in zinc oxide is not caused in the first phosphor layer.

Figure 3:
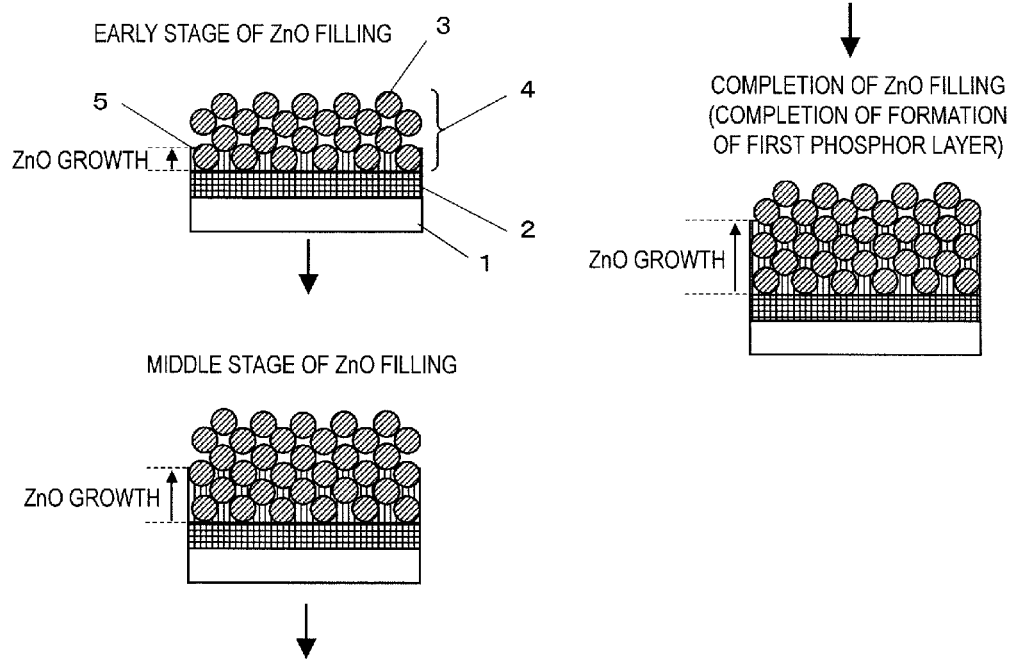
FIG. 3 is a sectional view illustrating a crystal growth process of zinc oxide using solution growth.

In a process of filling a space among the phosphor particles with zinc oxide in the c-axis orientation, solution growth may be used. In solution growth, zinc oxide in the c-axis orientation can be grown by using a solution containing Zn ions as a raw material solution and using the thin film of zinc oxide as a seed crystal to be a nucleus of the crystal growth of the zinc oxide. The raw material solution is a diluted aqueous solution, and thus, the viscosity thereof is low. Therefore, the raw material solution can reach inside the phosphor particle layer with ease. Further, the crystal growth reaction of zinc oxide can be caused under a state in which the substrate having the phosphor particle layer formed thereon is soaked in the raw material solution. In addition, the raw material for growing zinc oxide is Zn ions that are small, and thus, even when Zn ions are consumed by the crystal growth of zinc oxide, Zn ions diffuse from the raw material solution outside the phosphor particle layer to reach the inside of the phosphor particle layer with ease. Therefore, formation of a void in the phosphor particle layer due to lack of the raw material can be inhibited. Further, as illustrated in FIG. 3, in solution growth, zinc oxide crystals does not grow from a surface of the phosphor but zinc oxide crystals grow in due order of succession from a lower portion to the surface side of the phosphor particle layer using the thin film of zinc oxide which is formed below the phosphor particle layer as a seed crystal. Therefore, a void is not confined in the first phosphor layer and thus a void formed in the wavelength conversion element can be inhibited. Further, not only all the spaces in the phosphor particle layer are filled with zinc oxide but also the thickness of zinc oxide grown from the ZnO underlayer can be arbitrarily controlled, and the controllability thereof is high. The second phosphor layer is formed by filling spaces which remain in the phosphor particle layer, after the first phosphor layer is formed, with the material having a refractive index that is lower than that of zinc oxide, and thus, the thickness of the first phosphor layer and the thickness of the second phosphor layer can be controlled with ease, and the controllability thereof is high.

A summary of a wavelength conversion element, a method of manufacturing the same, and an LED element and a semiconductor laser light emitting device using the wavelength conversion element according to one embodiment of the present invention is as follows.

A wavelength conversion element according to one embodiment of the present invention includes: a plurality of phosphor particles; a first matrix located among a part of the plurality of phosphor particles and formed of zinc oxide in a c-axis orientation or single crystalline zinc oxide; and a second matrix located among a remaining part of the plurality of phosphor particles and formed of a material having a refractive index that is lower than a refractive index of the zinc oxide.

The wavelength conversion element may include: a first phosphor layer including the part of the plurality of phosphor particles and the first matrix; and a second phosphor layer including the remaining part of the plurality of phosphor particles and the second matrix.

A full width at half maximum (FWHM) of a c-axis of the zinc oxide in a c-axis orientation or single crystalline zinc oxide using an X-ray rocking curve method may be 4° or less.

The wavelength conversion element may further include a thin film held in contact with the first phosphor layer and formed of zinc oxide.

The wavelength conversion element may further include a substrate held in contact with the thin film, and the thin film may be located between the first phosphor layer and the substrate.

The wavelength conversion element may further include a substrate held in contact with the first phosphor layer.

The substrate may be formed of one selected from the group consisting of glass, quartz, silicon oxide, sapphire, gallium nitride, and zinc oxide.

The zinc oxide may be columnar crystals.

The single crystalline zinc oxide may be in the c-axis orientation.

The plurality of phosphor particles may include at least one selected from the group consisting of an yttrium aluminum garnet (YAG) phosphor and β-SiAlON.

The second matrix may include at least one selected from the group consisting of a high temperature sintered glass, a low temperature sintered glass, silicon dioxide, a liquid glass, an inorganic-organic complex, a silicone rubber-based highly heat-resistant light-transmitting resin, and a silicone resin.

The plurality of phosphor particles may be adjacent to one another and the first matrix and the second matrix may be held in contact with each other.

An LED element according to one embodiment of the present invention includes: a semiconductor light emitting element for emitting excitation light; and any one of the above-mentioned wavelength conversion elements into which the excitation light emitted from the semiconductor light emitting element enters.

The LED element may be directly formed on the semiconductor light emitting element.

The LED element may further include a crystal separation layer located between the wavelength conversion element and the semiconductor light emitting element.

The crystal separation layer may be formed of an amorphous material containing silicon dioxide as a main component.

The crystal separation layer may be formed by plasma-enhanced chemical vapor deposition.

The semiconductor light emitting element may include: an n-type GaN layer; a p-type GaN layer; and a light emitting layer formed of InGaN, the light emitting layer being sandwiched between the n-type GaN layer and the p-type GaN layer.

The excitation light may be light in a wavelength band of blue or blue-violet.

The plurality of phosphor particles may include a blue phosphor and a yellow phosphor, and the excitation light may be the light in the wavelength band of blue-violet. The blue phosphor may emit blue light by exciting the blue phosphor by the excitation light, and the yellow phosphor may emit yellow light by exciting the yellow phosphor by the excitation light or the blue light.

A semiconductor laser light emitting device according to one embodiment of the present invention includes: a semiconductor laser chip for emitting excitation light; and any one of the above-mentioned wavelength conversion elements into which the excitation light emitted from the semiconductor laser chip enters.

The excitation light may be light in a wavelength band of blue or blue-violet.

The plurality of phosphor particles may include a blue phosphor and a yellow phosphor, and the excitation light may be the light in the wavelength band of blue-violet. The blue phosphor may emit blue light by exciting the blue phosphor by the excitation light, and the yellow phosphor may emit yellow light by exciting the yellow phosphor by the excitation light or the blue light.

A vehicle according to one embodiment of the present invention includes: any one of the above-mentioned semiconductor laser light emitting devices; and a power supply for supplying electric power to the semiconductor laser light emitting device.

A method of manufacturing a wavelength conversion element according to one embodiment of the present invention includes: a step (a) of forming, on a thin film of zinc oxide in a c-axis orientation, a phosphor particle layer including a plurality of phosphor particles; a step (b) of filling, with zinc oxide, a part of spaces in the phosphor particle layer using solution growth to form a first phosphor layer including a part of the plurality of phosphor particles and a first matrix that is located thereamong and is formed of the zinc oxide; and a step (c) of filling, with a material having a refractive index that is lower than a refractive index of the zinc oxide, a remaining part of the spaces in the phosphor particle layer to form a second phosphor layer including a remaining part of the plurality of phosphor particles and a second matrix that is located thereamong and is formed of the material having the refractive index that is lower than the refractive index of the zinc oxide.

A full width at half maximum of a c-axis of the thin film of zinc oxide using an X-ray rocking curve method may be 4.5° or less.

The thin film of zinc oxide may be a single crystal which is epitaxially grown.

The step (a) of forming a phosphor particle layer may be carried out by electrophoresis.

The plurality of phosphor particles may include at least one selected from the group consisting of an yttrium aluminum garnet (YAG) phosphor and β-SiAlON.

The second matrix includes at least one selected from the group consisting of a high temperature sintered glass, a low temperature sintered glass, silicon dioxide, a liquid glass, an inorganic-organic complex, a silicone rubber-based highly heat-resistant light-transmitting resin, and a silicone resin.

Embodiments of the present invention are described in the following with reference to the drawings.

Embodiment 1

FIG. 1 is a sectional view of a wavelength conversion element of Embodiment 1.

A wavelength conversion element 10 according to this embodiment includes a first phosphor layer 7 and a second phosphor layer 8. The wavelength conversion element 10 converts at least a part of incident light into light in a wavelength band which is different from the wavelength band of the incident light and emits the converted light.

The first phosphor layer 7 includes a part of a plurality of phosphor particles 3 and a first matrix 5 located among the part of the plurality of phosphor particles 3 and formed of zinc oxide in a c-axis orientation. The second phosphor layer 8 includes the remaining part of the plurality of phosphor particles 3 and a second matrix 6 located among the remaining part of the plurality of phosphor particles 3 and formed of a material having a refractive index which is lower than that of zinc oxide. Specifically, in the wavelength conversion element 10, a part of spaces around the plurality of phosphor particles 3 are filled with the first matrix 5, and the remaining part is filled with the second matrix 6.

As the plurality of phosphor particles 3 included in the first phosphor layer 7 and the second phosphor layer 8, a phosphor having various excitation wavelengths, exiting light wavelengths, and particle diameters ordinarily used for a light emitting element can be used. For example, yttrium aluminum garnet (YAG), β-SiAlON, or the like can be used. In particular, the wavelength for exciting the phosphor and the wavelength of exiting light can be arbitrarily selected in accordance with the use of the wavelength conversion element 10. Further, in accordance with those wavelengths, an element with which YAG or β-SiAlON is doped can be selected.

In particular, when blue-violet light or blue light is selected as the wavelength of excitation light for exciting the first phosphor layer 7 and the second phosphor layer 8, the phosphor can be excited with efficiency, and thus, a light emitting element or a light emitting device such as a high output LED element or a high output semiconductor laser light emitting device can be realized.

Blue-violet light emitted from the light emitting element may excite a blue phosphor, and the generated blue light may be used to excite the phosphor particles 3 in the wavelength conversion element 10. Therefore, blue light which enters the wavelength conversion element 10 includes blue light from the blue phosphor.

When a yellow phosphor which is excited by blue light is used as the phosphor particles 3, light emitted from the wavelength conversion element 10 is white light which is composite light of blue light as the excitation light and yellow light from the phosphor. In this case, light having a wavelength of 400 nm to 420 nm is defined as blue-violet light, and light having a wavelength of 420 nm to 470 nm is defined as blue light. Further, light having a wavelength of 500 nm to 700 nm is defined as yellow light. A blue phosphor is a definition of a phosphor which is excited by blue-violet light and which emits blue light. Further, a yellow phosphor is a definition of a phosphor which is excited by blue light or blue-violet light and emits yellow light.

As the phosphor particles 3, both a blue phosphor which is excited by blue-violet light and a yellow phosphor which is excited by blue light may also be used. In this case, also, the wavelength conversion element 10 emits white light which is composite light of blue light and yellow light from the phosphors. Alternatively, as the phosphor particles 3, both a blue phosphor which is excited by blue-violet light and a yellow phosphor which is excited by blue-violet light may also be used. In this case, also, the wavelength conversion element 10 emits white light which is composite light of blue light and yellow light from the phosphors.

Further, for the purpose of enhancing the color rendering of the LED element and the semiconductor laser light emitting device, a phosphor which emits green light or a phosphor which emits red light may also be used together.

In the first phosphor layer 7, the first matrix 5 is formed of zinc oxide in the c-axis orientation. More specifically, zinc oxide in the c-axis orientation is columnar crystals or a single crystal having a crystal structure of the wurtzite type. The c-axis of zinc oxide is in parallel with the direction of the normal to a substrate 1, or, the c-axis is tilted by 4° or less with respect to the direction of the normal to the substrate 1. In this case, "the c-axis is tilted by 4° or less" means that the distribution of tilts of the c-axis is 4° or less, and does not necessarily mean that all the tilts of the crystallites are 4° or less. "The tilt of the c-axis" can be evaluated by the full width at half maximum of the c-axis using an X-ray rocking curve method. As described above, columnar crystals in the c-axis orientation have only a small number of grain boundaries in the c-axis direction.

In this embodiment, the phosphor particles 3 are in contact with one another in the first phosphor layer 7. The first matrix 5 is filled in spaces among the phosphor particles 3, and the first matrix 5 and the phosphor particles 3 are in contact with one another. In other words, the phosphor particles 3 are in contact with adjacent phosphor particles 3, and are, at the same time, in contact with the first matrix 5. Further, substantially no space exists in the first phosphor layer 7.

The first matrix 5 formed of zinc oxide in the c-axis orientation is formed using characteristics of crystal growth of zinc oxide. Therefore, the wavelength conversion element 10 may further include the substrate 1 and a thin film 2. The thin film 2 is in contact with, for example, a principal plane 7a of the first phosphor layer 7. Further, the substrate 1 is in contact with the thin film 2, and the thin film 2 is located between the substrate 1 and the first phosphor layer 7.

As described above, the substrate 1 is formed of one selected from the group consisting of glass, quartz, silicon oxide, sapphire, gallium nitride, and zinc oxide. When the substrate 1 formed of sapphire or gallium nitride is used, the principal plane of the substrate 1 may be the c-plane of those crystals. The thin film 2 is formed of single crystalline zinc oxide or polycrystalline zinc oxide.

The thin film 2 functions as a seed crystal to be a nucleus of the crystal growth of zinc oxide which forms the first matrix 5, and thus, the above-mentioned first matrix 5 of zinc oxide in the c-axis orientation can be formed.

The substrate 1 and the thin film 2 may be removed after the first matrix 5 is formed, or after the second matrix 6 described later is formed. The wavelength conversion element 10 is not necessarily required to include the substrate 1 or both the substrate 1 and the thin film 2. Further, insofar as zinc oxide in the c-axis orientation can be directly formed on the substrate 1, the wavelength conversion element 10 may include the substrate 1 and may not include the thin film 2. With regard to zinc oxide in the c-axis orientation when the substrate 1 is removed, the c-axis of zinc oxide in the first matrix 5 is in parallel with the direction of the normal to the principal plane 7a or a principal plane 7b of the first phosphor layer 7, or, the c-axis is tilted by 4° or less with respect to the direction of the normal to the principal plane 7a or 7b of the first phosphor layer 7. Specifically, when the full width at half maximum of the c-axis using the X-ray rocking curve method is 4° or less, zinc oxide having only a small number of grain boundaries in the c-axis direction can be formed.

In the second phosphor layer 8, the second matrix 6 is formed of a material having a refractive index which is lower than that of zinc oxide. The refractive index of zinc oxide varies to some extent depending on the crystalline state and the manufacturing method, but is about 1.9 or more and 2.0 or less. It is enough that the second matrix 6 is formed of a material having a refractive index which is lower than that of zinc oxide used as the first matrix 5. The second matrix 6 has a refractive index which is lower than that of zinc oxide, and is a light-transmitting material in an amorphous (glass) state. The second matrix 6 can be formed of, for example, glass containing a silicate as a main component, glass containing a phosphate as a main component, glass containing a borate as a main component, glass formed by the sol-gel method using a silica source such as silicon dioxide ($SiO_2$) or tetraethoxysilane as a raw material, a liquid glass such as polysilazane which is a liquid raw material before being cured and which is a solid after being cured, an inorganic-organic complex such as silsesquioxane which is an intermediate between silicon dioxide ($SiO_2$) and a silicone ($R_2SiO$), a silicone rubber-based and highly heat-resistant light-transmitting resin in which a siloxane skeleton has a straight chain structure, or a silicone resin in which a siloxane skeleton has a branch structure. The glass having any one of the above-mentioned main components may be a high temperature sintered glass or may be a low temperature sintered glass. A high temperature sintered glass means a substance which becomes glass by being sintered at a temperature of about 600° C. or higher. A low temperature sintered glass means a substance which becomes glass by being sintered at a temperature of about 200° C. or higher and 600° C. or lower.

The second matrix 6 may include at least one selected from the group consisting of such a high temperature sintered glass, a low temperature sintered glass, silicon dioxide, a liquid glass, an organic-inorganic complex, and resins. The refractive indices of sintered glasses, a liquid glass, an inorganic-organic complex, and the like are, for example, 1.4 or more and 1.6 or less. Further, the refractive indices of resins such as a silicone rubber-based and highly heat-resistant resin and a silicone resin are, for example, 1.4 or more and 1.6 or less.

The phosphor particles 3 are in contact with one another in the second phosphor layer 8. The second matrix 6 is filled in spaces among the phosphor particles 3, and the second matrix 6 and the phosphor particles 3 are in contact with one another. In other words, the phosphor particles 3 are in contact with adjacent phosphor particles 3, and are, at the same time, in contact with the second matrix 6. Further, substantially no space exists in the second phosphor layer 8.

The phosphor particles 3 in the second phosphor layer 8 have composition which is the same as that of the phosphor particles 3 in the first phosphor layer 7, and also have a concentration of the phosphor contained therein which is the same as that of the phosphor particles 3 in the first phosphor layer 7. In other words, a part of the same plurality of phosphor particles 3 is included in the first phosphor layer 7, and the remaining part is included in the second phosphor layer 8. The density of the phosphor particles 3 in the second phosphor layer 8 may be the same as or may be different from the density of the phosphor particles 3 in the first phosphor layer 7.

As illustrated in FIG. 1, the second matrix 6 fills a part of the spaces among the phosphor particles 3 in which the first matrix 5 is not located so as to be in contact with the first matrix 5. In this way, the second phosphor layer 8 is placed so as to be in contact with the first phosphor layer 7. The second phosphor layer 8 and the first phosphor layer 7 are defined by an interface between the first matrix 5 and the second matrix 6. Therefore, a part of the plurality of phosphor particles 3 which are located at the interface between the first matrix 5 and the second matrix 6 may belong to the first phosphor layer 7 and the remaining part may belong to the second phosphor layer 8.

In the wavelength conversion element 10, light which enters the principal plane 7a of the first phosphor layer 7 passes through the first phosphor layer 7 and the second phosphor layer 8 to be emitted from a principal plane 8b of the second phosphor layer 8. In this case, at least a part of the light is converted into light in a wavelength band which is different from the wavelength band of the incident light and the converted light is emitted. Light which enters the principal plane 8b of the second phosphor layer 8 passes through the second phosphor layer 8 and the first phosphor layer 7 to be emitted from the principal plane 7a of the first phosphor layer 7. In this case, in each of the first phosphor layer 7 and the second phosphor layer 8, the phosphor particles 3 excite at least a part of the light into light in a wavelength band which is different from the wavelength band of the incident light and emit the converted light.

In the first phosphor layer 7 and the second phosphor layer 8, the phosphor particles 3 are formed of the same material, but the refractive index of the first matrix 5 and the refractive index of the second matrix 6 are different from each other. Therefore, the refractive index difference between the phosphor particles 3 and the first matrix 5 in the first phosphor layer 7 and the refractive index difference between the phosphor particles 3 and the second matrix 6 in the second phosphor layer 8 are different from each other. This causes the ratio between light which enters the phosphor particles 3 to excite the phosphor and light which does not enter the phosphor particles and passes through the layer to be different between the first phosphor layer 7 and the second phosphor layer 8, and also causes the ratio between the generated fluorescence and the transmitted light to be different between the first phosphor layer 7 and the second phosphor layer 8. As a result, when light having the same wavelength enters the first phosphor layer 7 and the second phosphor layer 8, the chromaticity of light which is a mixture of fluorescence and transmitted light differs depending on from which of the first phosphor layer 7 and the second phosphor layer 8 the light is emitted.

Therefore, according to this embodiment, by adjusting a thickness t1 of the first phosphor layer 7 and a thickness t2 of the second phosphor layer 8 (thicknesses in the directions of the normals to the principal plane 7a and the principal plane 7b, respectively), or, the ratio between the thicknesses, the chromaticity of light emitted from the wavelength conversion element 10 can be changed. For example, even if the light emission wavelength of a light emitting element to be a light source of light which enters the wavelength conversion element 10 varies, by adjusting the thicknesses of the first phosphor layer 7 and the second phosphor layer 8, variations in chromaticity of light emitted from the wavelength conversion element 10 can be inhibited.

Further, according to the wavelength conversion element of this embodiment, in the first phosphor layer, the first matrix formed of zinc oxide fills in space among the phosphor particles, and thus, the resistance thereof to heat is high. The refractive index of zinc oxide is high, and thus, scattering of light which enters the phosphor particles can be inhibited. Further, zinc oxide is in the c-axis orientation, and thus, the number of grain boundaries is small in the direction of light emission, and a void can be inhibited. Therefore, light can be taken outside from the wavelength conversion element with efficiency.

A method of manufacturing the wavelength conversion element 10 according to this embodiment is described in the following with reference to the drawings.

FIGS. 2A, 2B, 2C, and 2D are sectional views illustrating a method according to Embodiment 1.

In Embodiment 1, a part of spaces in a phosphor particle layer 4 which is formed of the phosphor particles 3 are filled with zinc oxide in the c-axis orientation which is grown from the thin film 2 of zinc oxide, and the remaining part of the spaces are filled with a material having a refractive index which is lower than that of zinc oxide.

Figure 2A:
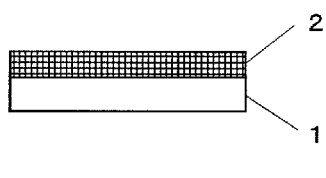
FIGS. 2A to 2D are sectional views illustrating a method of manufacturing the wavelength conversion element in Embodiment 1.

First, as illustrated in FIG. 2A, the thin film 2 of zinc oxide is formed on the substrate 1. As the substrate 1, a highly transparent substrate may be used. A glass substrate, a quartz substrate, or the like can be used. A polyethylene naphthalate (PEN) film, a polyethylene terephthalate (PET) film, or the like may also be used. When a reflection type wavelength conversion element, which reflects fluorescence from the phosphor particles or excitation light on an end face of the wavelength conversion element, is used in a semiconductor laser light emitting device, the substrate 1 may be not only a transparent substrate but also an opaque substrate. A reflective layer of silver, aluminum, or the like having a high reflection coefficient may be provided on a front surface or a rear surface of the substrate 1. In order for the substrate 1 to act both as a reflective layer and a substrate, a silicon substrate, an aluminum substrate, or the like which has a high reflection coefficient may also be used as the substrate 1.

When the substrate 1 used is formed of an amorphous material which does not have a crystal structure such as glass, or, when the substrate 1 used is a single crystalline substrate but the lattice mismatch ratio between the crystal structure of the substrate and the crystal structure of zinc oxide is high, the thin film 2 is formed of polycrystalline zinc oxide.

As the method of forming the thin film 2 of zinc oxide, vacuum deposition such as electron beam deposition, reactive plasma deposition, sputtering, or pulse laser deposition is used. In vacuum deposition, the thin film 2 of zinc oxide in the c-axis orientation can be formed in accordance with film forming conditions such as the substrate temperature and the plasma density when the film is formed, thermal treatment after the film formation, and the like. Further, for the purpose of obtaining the thin film 2 of zinc oxide in the c-axis orientation having a low electrical resistance, the thin film of zinc oxide may be doped with an element such as Ga, Al, or B.

Figure 2B:
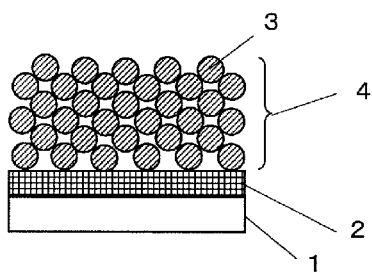

Then, as illustrated in FIG. 2B, the phosphor layer 4 formed of the phosphor particles 3 is formed on the thin film 2 of zinc oxide which itself is formed on the substrate 1. With regard to the method of forming the phosphor particle layer 4, a phosphor dispersed solution in which the phosphor particles 3 are dispersed is prepared, and the phosphor particles 3 can be accumulated on the thin film 2 of zinc oxide using electrophoresis. Alternatively, the phosphor particle layer 4 may be formed by settling the phosphor particles 3 in the phosphor dispersed solution.

Figure 2C:
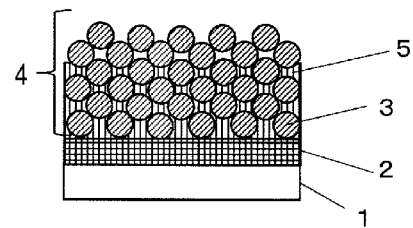

Then, as illustrated in FIG. 2C, the first matrix 5 formed of zinc oxide in the c-axis orientation is grown from the thin film 2 of zinc oxide in the c-axis orientation by solution growth using a solution containing Zn ions, and a part of the spaces among the phosphor particles 3 are filled with the first matrix 5. In this way, the first phosphor layer 7 is formed. As the solution growth, chemical bath deposition under atmospheric pressure, hydrothermal synthesis at pressures above atmospheric pressure, electrochemical deposition in which voltage or current is applied, or the like is used. As the solution for the crystal growth, for example, an aqueous solution of zinc nitrate $(Zn(NO_3)_2)$ containing hexamethylenetetramine $(C_6H_{12}N_4)$ is used. Exemplary pH of the aqueous solution of zinc nitrate is 5 or more and 7 or less. Those kinds of solution growth are disclosed in, for example, Japanese Patent Application Laid-Open Publication No. 2004-315342.

FIG. 3 illustrates a process midway through formation of the first matrix 5 formed of zinc oxide in the c-axis orientation by crystal growth from the thin film 2 of zinc oxide in the c-axis orientation illustrated in FIG. 2C. By using solution growth, zinc oxide is not directly grown from the phosphor particles 3 but zinc oxide in the c-axis orientation can be grown upward in due order of succession from the thin film 2 formed below the first phosphor layer 7 with the thin film 2 being the seed crystal. At this time, only a part of the spaces in the phosphor particle layer 4 is filled with zinc oxide in the c-axis orientation.

Figure 2D:
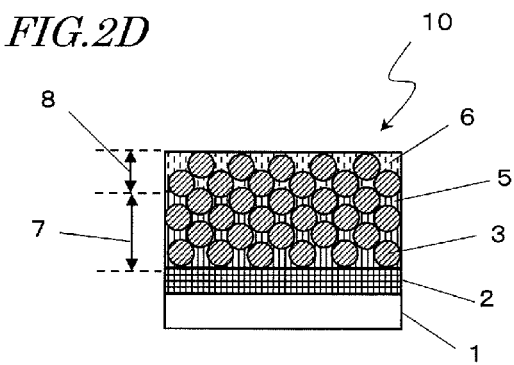

Further, as illustrated in FIG. 2D, the remaining part of the spaces located above the phosphor particle layer 4 is filled with the second matrix 6 to form the second phosphor layer 8. For example, the second matrix 6 is formed by the sol-gel method. A sol of alkoxide such as tetramethoxysilane is filled in the spaces among the phosphor particles 3 above the first phosphor layer 7, and, by carrying out dehydration condensation and heating, the second matrix 6 formed of glass is formed.

In this way, the second phosphor layer 8 can be formed, and the wavelength conversion element 10 including the first phosphor layer 7 and the second phosphor layer 8 is completed.

Embodiment 2

Figure 4:
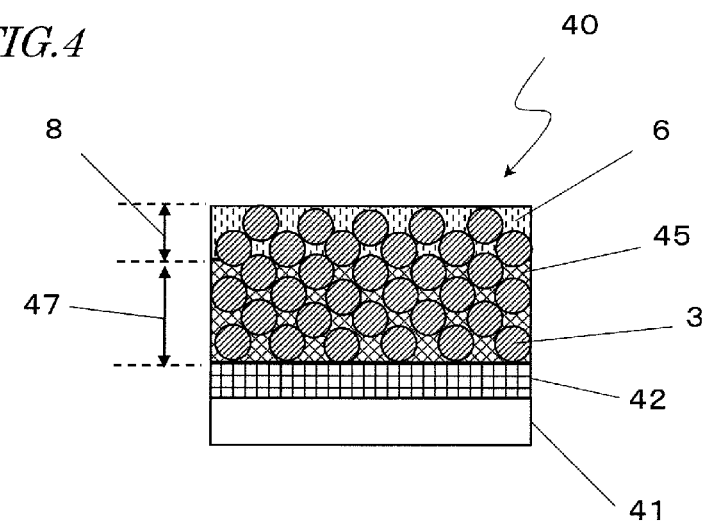
FIG. 4 is a sectional view of a wavelength conversion element in Embodiment 2.

FIG. 4 is a sectional view of a wavelength conversion element according to Embodiment 2. A wavelength conversion element 40 according to this embodiment includes a substrate 41, a thin film 42, a first phosphor layer 47, and the second phosphor layer 8. The first phosphor layer 47 includes a part of the plurality of phosphor particles 3 and a first matrix 45 located thereamong. The first matrix 45 is formed of single crystalline zinc oxide. Further, the substrate 41 is a single crystalline substrate, and the thin film 42 is formed of single crystalline zinc oxide. The second phosphor layer 8 is the same as the second phosphor layer 8 of Embodiment 1.

In Embodiment 2, a part of the spaces in the phosphor particle layer 4 which is formed of the phosphor particles 3 is filled with single crystalline zinc oxide which is epitaxially grown from the thin film 42 of single crystalline zinc oxide, and the remaining part of the spaces is filled with a material having a refractive index which is lower than that of zinc oxide.

According to the wavelength conversion element of this embodiment, the first matrix 45 is formed of single crystalline zinc oxide, and thus, the number of the grain boundaries in the first matrix 45 is further reduced so that scattering of light which enters the first phosphor layer is further reduced. Therefore, the wavelength conversion element according to this embodiment can take out light to the outside with further efficiency.

A method of manufacturing the wavelength conversion element according to this embodiment is described in the following with reference to the drawings.

FIGS. 5A, 5B, 5C, and 5D are sectional views illustrating the method according to Embodiment 2.

As the substrate 41, a single crystalline substrate having a low lattice mismatch ratio between the crystal structure of zinc oxide and the crystal structure of the substrate is used. In this case, zinc oxide can be grown with a predetermined relationship between the crystal orientation of the substrate 41 and the crystal orientation of the thin film 42 of zinc oxide. This growth is hereinafter referred to as epitaxial growth. In the epitaxial thin film 42, crystals are oriented in the same direction as a whole, and, except for a crystal defect and the like, basically no grain boundary is formed. In this way, a single crystal means a crystal which is epitaxially grown and has a significantly small number of grain boundaries. As the substrate 41 on which the thin film 42 of single crystalline zinc oxide can be epitaxially grown, a sapphire substrate, a GaN substrate, a zinc oxide substrate, or the like can be used. As the substrate 41, the above-mentioned single crystalline substrate having a buffer layer formed thereon for alleviating the lattice mismatch ratio between the crystal structures of the substrate and zinc oxide may also be used. For example, as the substrate 41, a sapphire substrate having a single crystalline GaN thin film formed thereon may also be used. When, similarly to the case of Embodiment 1, a reflection type wavelength conversion element, which reflects fluorescence from the phosphor particles or excitation light on an end face of the wavelength conversion element, is used in a semiconductor laser light emitting device, the substrate 41 may be not only a transparent substrate but also an opaque substrate. A reflective layer of silver, aluminum, or the like having a high reflection coefficient may be provided on a front surface or a rear surface of the substrate 41. In order for the substrate 41 to act both as a reflective layer and a substrate, a single crystalline silicon substrate which has a high reflection coefficient may also be used as the substrate 41.

Figure 5A:
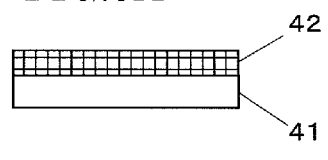
FIGS. 5A to 5D are sectional views illustrating a method of manufacturing the wavelength conversion element in Embodiment 2.

As illustrated in FIG. 5A, the thin film 42 is formed on the substrate 41. As the method of forming the thin film 42 of single crystalline zinc oxide, vacuum deposition similar to that in Embodiment 1 is used. Further, when the front surface of the substrate 41 can be a seed crystal of zinc oxide in solution growth, the thin film 42 of single crystalline zinc oxide may be formed by solution growth. For example, the thin film 42 of single crystalline zinc oxide may be formed by solution growth on a sapphire substrate having a single crystalline GaN thin film formed thereon.

Figure 5C:
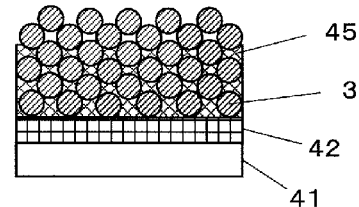
Figure 5B:
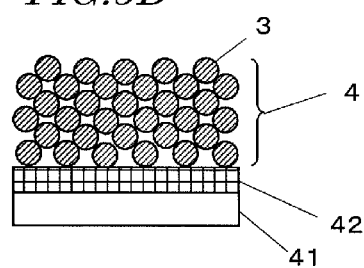

Then, as illustrated in FIG. 5B, the phosphor particle layer 4 formed of the phosphor particles 3 is formed on the thin film 42 of single crystalline zinc oxide which itself is formed on the substrate 41. As the method of forming the phosphor particle layer 4, a method similar to that in Embodiment 1 is used.

Then, as illustrated in FIG. 5C, the first matrix 45 formed of single crystalline zinc oxide is grown by solution growth using a solution containing Zn ions from the thin film 42 of single crystalline zinc oxide to form the first phosphor layer 47. In forming single crystalline zinc oxide in the c-axis orientation, a method similar to that in Embodiment 1 can be used. Similarly to the case of Embodiment 1, only a part of the spaces in the phosphor particle layer 4 is filled with single crystalline zinc oxide.

Figure 5D:
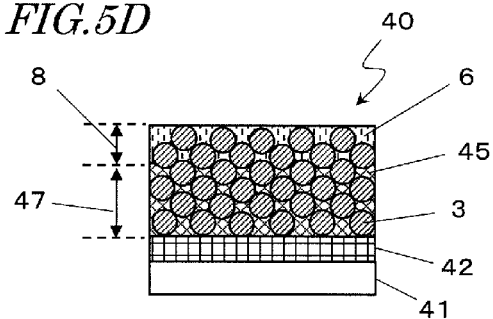

Further, as illustrated in FIG. 5D, the remaining part of the spaces above the phosphor particle layer 4 is filled with the second matrix 6 to form the second phosphor layer 8. In forming the second matrix 6, a method similar to that in Embodiment 1 is used.

Embodiment 3

An LED element according to an embodiment of the present invention is described.

Figure 6A:
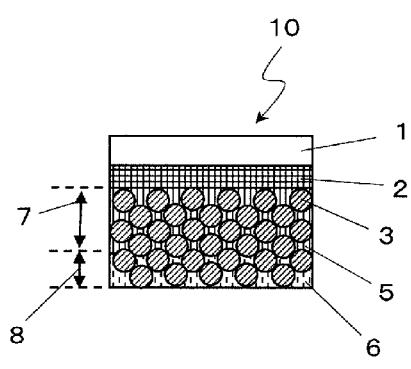
FIGS. 6A and 6B are sectional views of a wavelength conversion element and an LED element, respectively, in Embodiment 3.

The LED element according to this embodiment can use any one of the wavelength conversion elements according to Embodiments 1 and 2. FIG. 6A illustrates the wavelength conversion element 10 described in Embodiment 1 in a state of being upside down.

Figure 6B:
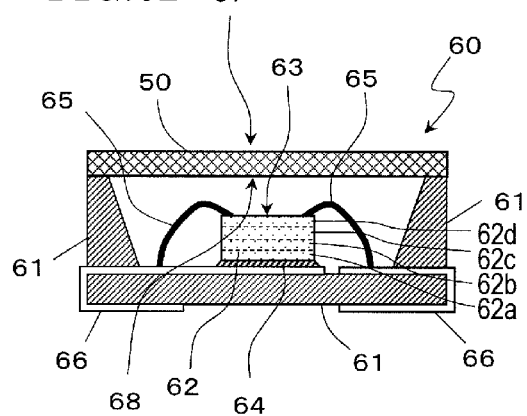

FIG. 6B is a sectional view of the LED element according to Embodiment 3. Electrodes of the LED chip, the internal structure of the LED chip, and the like are simplified for the sake of easy understanding. As illustrated in FIG. 6B, an LED element 60 includes a support 61, an LED chip 62, and a wavelength conversion element 50. As described above, as the wavelength conversion element 50, the wavelength conversion element 10 described in Embodiment 1 or the wavelength conversion element 40 described in Embodiment 2 is used.

The support 61 supports the LED chip 62. In this embodiment, the LED element 60 has a structure which enables surface mounting. This embodiment is suitably used for a high-brightness LED element, and thus, for the purpose of enabling efficient diffusion to the outside of heat generated by the LED element, the support 61 may have a high thermal conductivity. For example, ceramic formed of alumina, aluminum nitride, or the like may be used as the support 61. The LED chip 62 emits excitation light for exciting the phosphor of the wavelength conversion element 50. The LED chip 62 includes, for example, a substrate 62a, an n-type GaN layer 62b, a p-type GaN layer 62d, and a light emitting layer 62c formed of InGaN and sandwiched between the n-type GaN layer 62b and the p-type GaN layer 62d. The LED chip 62 emits, for example, blue light. The LED chip 62 is fixed onto the support 61 by solder 64 or the like under a state in which a surface 63 from which light from the LED chip is emitted is on the upside. Further, the LED chip 62 is electrically connected via bonding wires 65 to electrodes 66 which are provided on the support. The LED chip 62 is surrounded by the support 61, and the wavelength conversion element 50 is fixed to the support 61. When the wavelength conversion element 50 is, as illustrated in FIG. 6A, placed so that the substrate 1 side thereof is on a side of a surface 67 from which light from the LED element is emitted, the first phosphor layer 7 and the second phosphor layer 8 are not exposed to the outside. However, the substrate 1 of the wavelength conversion element 50 may be placed on a side of a surface 68 into which light from the LED chip 62 enters.

In the LED element 60, excitation light emitted from the surface 63, from which light from the LED chip 62 is emitted, enters the wavelength conversion element 50. In the wavelength conversion element 50, a part of excitation light which enters the wavelength conversion element 50 enters the phosphor particles 3 to excite the phosphor. Thus, light in a wavelength band that is different from that of the excitation light is emitted. For example, when the phosphor is a yellow phosphor, blue light as the excitation light enters and yellow light is emitted.

Excitation light which does not enter the phosphor particles 3 passes through the wavelength conversion element 50 as it is. In this way, light which is emitted from the wavelength conversion element 50 includes blue light and yellow light, and thus, the LED element 60 emits white light. As described in Embodiment 1, according to this embodiment, even if the wavelength of light emitted from the LED chip 62 varies, by adjusting the thicknesses of the first phosphor layer 7 and the second phosphor layer 8 (or the ratio between the thicknesses), variations in light emitted from the wavelength conversion element can be inhibited.

Embodiment 4

An LED element according to another embodiment of the present invention is described. In Embodiment 4, LED elements using a wavelength conversion element which is formed by a method similar to that used in Embodiment 1 are described. The first matrix 5 used in the first phosphor layer is formed of zinc oxide columnar crystals in the c-axis orientation.

FIGS. 7A and 7B and FIGS. 8A and 8B are sectional views of the LED elements in Embodiment 4. The electrodes of the LED chips, the support, the electrodes, and the wiring of the LED elements, and the like are simplified for the sake of easy understanding.

Figure 7A:
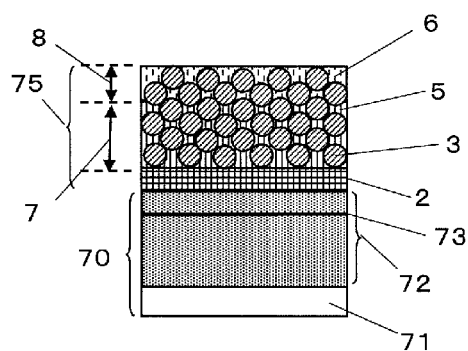
FIGS. 7A and 7B are sectional views of LED elements, respectively, in Embodiment 4.

The LED element illustrated in FIG. 7A includes an LED chip 70 and a wavelength conversion element 75. The LED chip 70 includes a substrate 71 and a semiconductor light emitting element 72 located on the substrate 71. The semiconductor light emitting element 72 further includes a light emitting layer 73. The wavelength conversion element 75 is directly formed on the semiconductor light emitting element 72, and has a structure of the wavelength conversion element 10 according to Embodiment 1 with the substrate 1 thereof being removed. In other words, the wavelength conversion element 75 includes the thin film 2 formed on the semiconductor light emitting element 72, the first phosphor layer 7, and the second phosphor layer 8.

Figure 7B:
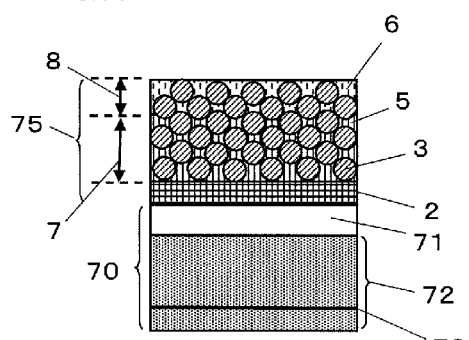

The LED element illustrated in FIG. 7B also includes the LED chip 70 and the wavelength conversion element 75, and the LED chip 70 is in a state of being upside down with respect to the LED element illustrated in FIG. 7A. In other words, the light emitting layer 73 of the LED chip 70 is located on a side opposite to the wavelength conversion element 75. The wavelength conversion element 75 includes the thin film 2 formed on the substrate 71, the first phosphor layer 7, and the second phosphor layer 8.

As the substrate 71, for example, a sapphire substrate or a GaN substrate may be used. Those substrates are highly transparent, and a semiconductor light emitting element having satisfactory characteristics and including n-type GaN, a light emitting layer formed of InGaN, and p-type GaN can be formed on those substrates.

Both in the structure illustrated in FIG. 7A and in the structure illustrated in FIG. 7B, by using the LED chip 70 as the substrate, the wavelength conversion element 75 can be formed by a method similar to that used in Embodiment 1 on the semiconductor light emitting element 72 side or on the side of the substrate 71 of the semiconductor light emitting element.

Figure 8A:
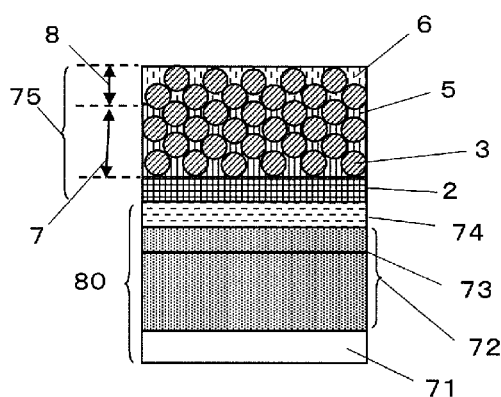
FIGS. 8A and 8B are sectional views of other LED elements, respectively, in Embodiment 4.
Figure 8B:
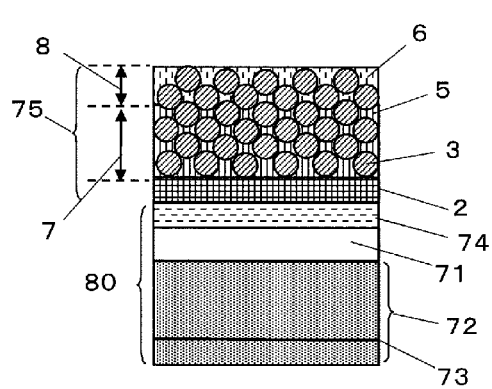

The LED elements according to this embodiment may also be formed using an LED chip 80 including a crystal separation layer 74 and using the wavelength conversion element 75. Specifically, as illustrated in FIG. 8A and FIG. 8B, the wavelength conversion element 75 can be formed by a method similar to that used in Embodiment 1 on the semiconductor light emitting element 72 or on the substrate 71 of the semiconductor light emitting element, by using the LED chip 80 having the crystal separation layer 74 formed thereon as the substrate. The crystal separation layer 74 is an underlayer for forming the thin film 2 formed of zinc oxide in the c-axis orientation. The crystal separation layer 74 can be formed of, for example, a material whose main component is amorphous silicon dioxide ($SiO_2$) not having a crystal structure, using plasma-enhanced chemical vapor deposition. Glass formed of a liquid glass raw material such as polysilazane may also be used. By forming the crystal separation layer 74, even when, for example, the substrate 71 of the semiconductor light emitting element is an m-plane of a GaN substrate and the semiconductor light emitting element 72 has a crystal structure which is epitaxially grown on the substrate 71, the crystal separation layer 74 is amorphous and does not have a crystal structure similarly to a glass substrate, and thus, irrespective of the crystal structure of the substrate 71, the thin film 2 of zinc oxide in the c-axis orientation can be formed. The thin film 2 of zinc oxide is in the c-axis orientation, and thus, the first matrix 5 of the first phosphor layer 7 can be formed of zinc oxide in the c-axis orientation by a method similar to that used in Embodiment 1.

Embodiment 5

An LED element according to still another embodiment of the present invention is described. In Embodiment 5, LED elements using a wavelength conversion element which is formed by a method similar to that used in Embodiment 2 are described. Embodiment 5 is an example in which the first matrix used in the first phosphor layer is formed of single crystalline zinc oxide.

Figure 9A:
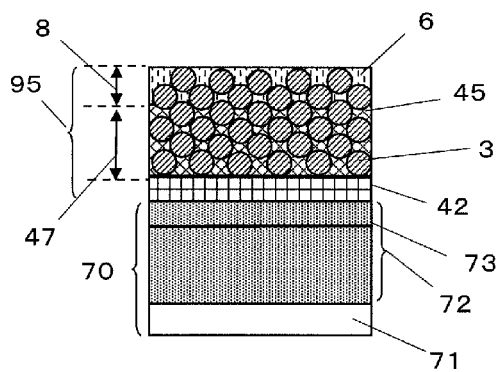
FIGS. 9A and 9B are sectional views of LED elements, respectively, in Embodiment 5.
Figure 9B:
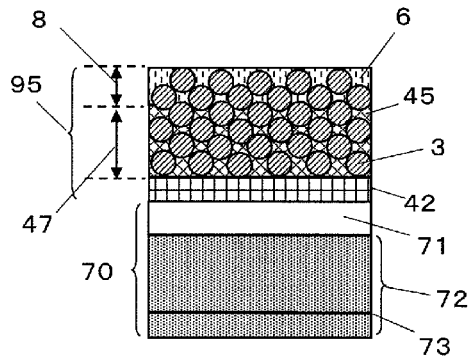

FIGS. 9A and 9B are sectional views of the LED elements in Embodiment 5. The electrodes of the LED chips, the support, the electrodes, and the wiring of the LED elements, and the like are simplified for the sake of easy understanding.

The LED elements according to Embodiment 5 include the LED chip 70 and a wavelength conversion element 95.

The wavelength conversion element 95 includes the thin film 42 of single crystalline zinc oxide, a first phosphor layer 47, and the second phosphor layer 8. Similarly to the case of Embodiment 2, the first matrix 45 of the first phosphor layer 47 is formed of single crystalline zinc oxide. The LED chip includes, similarly to the case of Embodiment 4, the semiconductor light emitting element 72 and the substrate 71.

Insofar as the surface of the semiconductor light emitting element 72 or the substrate 71 of the semiconductor light emitting element has a crystal structure which enables formation of the thin film 42 of single crystalline zinc oxide, as illustrated in FIG. 9A and FIG. 9B, the thin film 42 of single crystalline zinc oxide can be formed on the semiconductor light emitting element 72 side or on the side of the substrate 71 of the semiconductor light emitting element by using the LED chip 70 as the substrate. The thin film 42 of zinc oxide is single crystalline, and thus, the first matrix 45 of the first phosphor layer 47 can be formed of single crystalline zinc oxide by a method similar to that used in Embodiment 2.

As the substrate 71 of the semiconductor light emitting element, for example, a c-plane of a sapphire substrate or a c-plane of a GaN substrate can be used. In particular, both zinc oxide and gallium nitride have a crystal structure of the wurtzite type. The lattice mismatch ratios therebetween along the a-axis and along the c-axis are 1.8% and 0.4%, respectively. Both the lattice mismatch ratios are significantly low. Therefore, the thin film 2 formed of single crystalline zinc oxide can be epitaxially grown on the semiconductor light emitting element side or on the substrate side.

Embodiment 6

A semiconductor laser light emitting device according to an embodiment of the present invention is described.

Figure 10:
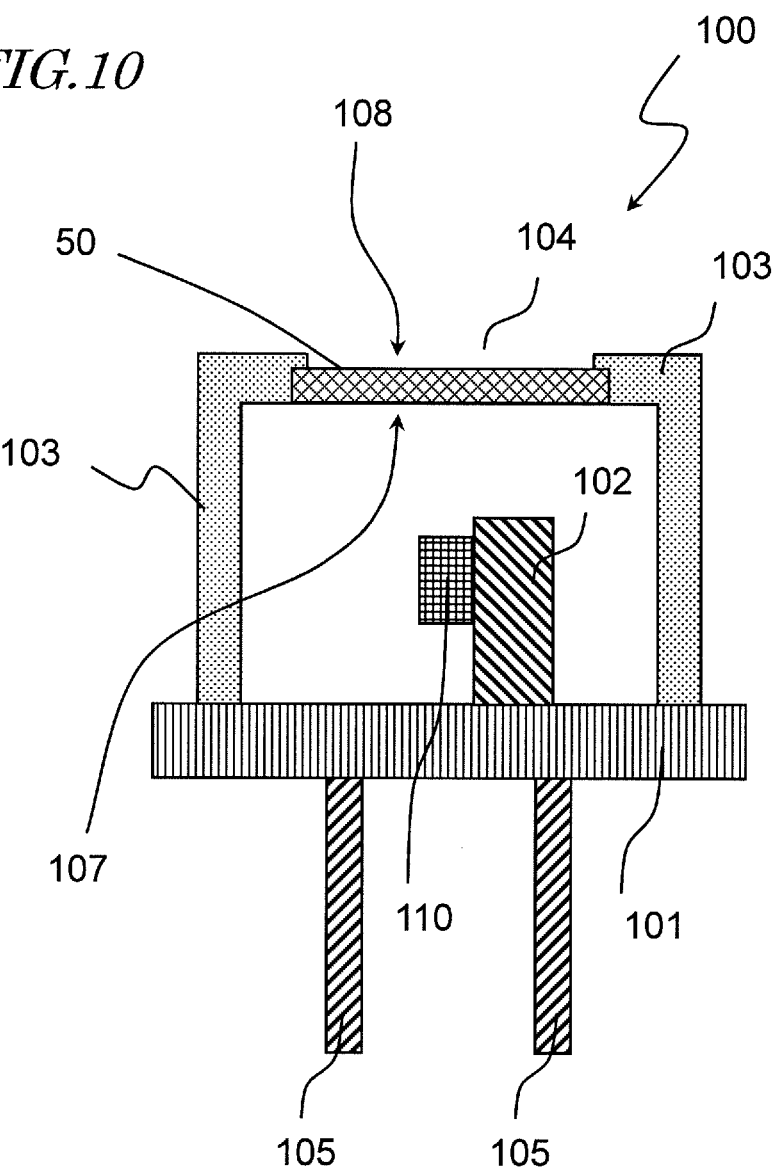
FIG. 10 is a sectional view of a semiconductor laser light emitting device in Embodiment 6.

FIG. 10 is a sectional view of a semiconductor laser light emitting device 100 according to Embodiment 6. The internal structure, electrodes, connection wiring, and the like of the semiconductor laser chip are simplified for the sake of easy understanding. The semiconductor laser light emitting device 100 includes a semiconductor laser chip 110, the wavelength conversion element 50, and a stem 101 for supporting the semiconductor laser chip 110 and the wavelength conversion element 50. The semiconductor laser chip 110 is supported via a block 102 by the stem 101, and the wavelength conversion element 50 is supported via a cap 103 by the stem 101. The stem 101 and the block 102 are formed of a metallic material mainly containing Fe or Cu, are formed in one piece using a mold, and, in operation, efficiently discharge heat generated in the semiconductor laser chip 110. The cap 103 is formed of a metallic material mainly containing Fe and Ni, and is fused to the stem 101 by welding or the like. The semiconductor laser chip 110 is mounted on the block 102, and bonding wires electrically connect the semiconductor laser chip 110 and leads 105. An opening 104 is provided in the cap 103, and the wavelength conversion element 50 according to Embodiment 1 or 2 is provided so as to cover the opening 104. Excitation light from the semiconductor laser chip 110 enters the wavelength conversion element 50 from a light entering surface 107. The semiconductor laser light emitting device 100 emits, from a light emitting surface 108, light which is a composite of excitation light that passes through the wavelength conversion element 50 and fluorescence that is converted from the excitation light.

In FIG. 10, the semiconductor laser chip 110 is directly mounted on the block 102, but the semiconductor laser chip 110 may be mounted on the block 102 via a submount formed of AlN, Si, or the like.

The semiconductor laser light emitting device 100 has an advantage in that, if the substrate of the wavelength conversion element 50 is placed on the light emitting surface 108 side, the wavelength conversion element is not exposed to the outside. However, the substrate may also be placed on the light entering surface 107 side.

Embodiment 7

A headlight and a vehicle according to an embodiment of the present invention are described. In Embodiment 7, a headlight and a vehicle which use any one of the wavelength conversion elements according to Embodiments 1 and 2 are described.

Figure 11A:
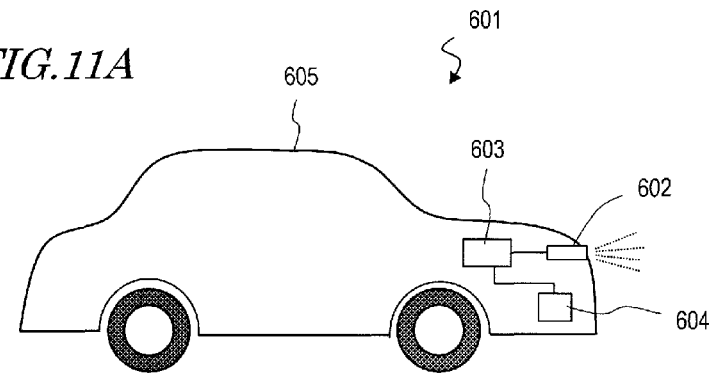
FIGS. 11A to 11C are views illustrating structures of a vehicle and a headlight, respectively, in Embodiment 7.

FIG. 11A schematically illustrates a structure of the vehicle according to this embodiment. A vehicle 601 includes a vehicle body 605, a headlight 602 provided at a front portion of the vehicle body 605, a power supply 603, and an electric generator 604. The electric generator 604 is rotationally driven by a drive source such as an engine (not shown) to generate electric power. The generated electric power is stored in the power supply 603. In this embodiment, the power supply 603 is a secondary battery which can be charged and discharged. When the vehicle 601 is an electric car or a hybrid car, a motor for driving the vehicle may be the electric generator 604. The headlight 602 is lit by electric power from the power supply.

Figure 11B:
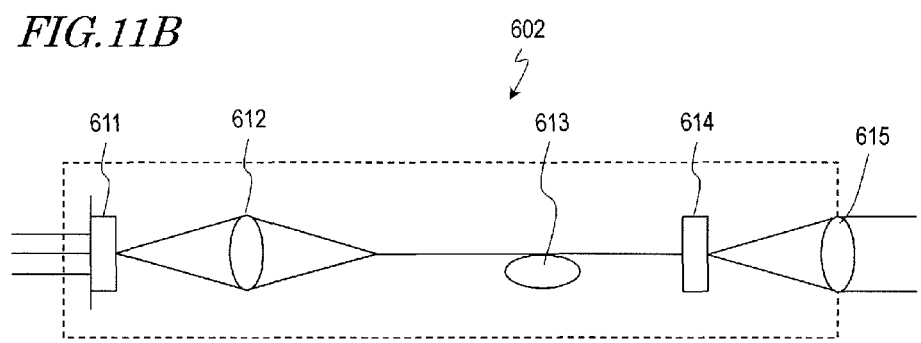

FIG. 11B illustrates a schematic structure of the headlight 602. The headlight 602 includes a semiconductor laser chip 611, an optical system 612, an optical fiber 613, a wavelength conversion element 614, and an optical system 615. The semiconductor laser chip 611 has a structure in which, for example, the semiconductor laser light emitting device 100 according to Embodiment 6 is provided with a transparent plate instead of the wavelength conversion element 50.

Light emitted from the semiconductor laser chip 611 is condensed by the optical system 612 to an end of the optical fiber 613 to pass through the optical fiber 613. Light which is emitted from the other end of the optical fiber 613 enters the wavelength conversion element 614 and at least a part of the wavelengths is converted to be emitted. Further, the optical system 615 controls the range of lighting. In this way, the headlight 602 lights the way ahead the vehicle 601.

Figure 11C:
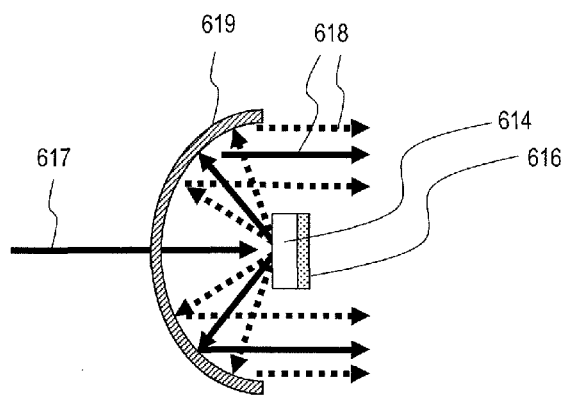

FIG. 11C is an enlarged view of the vicinity of the wavelength conversion element 614 in a headlight using a reflection type wavelength conversion element. Incident light 617 emitted from the semiconductor laser chip 611 enters the wavelength conversion element 614 which includes a reflective layer 616. Exiting light 618 obtained by converting at least a part of the incident light is reflected by a projection mirror 619 to be emitted.

According to the headlight of this embodiment, the first matrix in the first phosphor layer of the wavelength conversion element is formed of an inorganic material having a high thermal conductivity and high resistance to heat, and thus, even when the wavelength conversion element is used for a headlight which may emits highly intense light, the wavelength conversion element has excellent heat discharging property and excellent resistance to heat, and deterioration of the phosphor layer due to heat is inhibited for a long time. Further, the emission efficiency is high, and thus, electric power consumption of the power supply is low. Still further, light emitted from the semiconductor laser chip is introduced by the optical fiber to the wavelength conversion element, and thus, the arrangement of the semiconductor laser chip and the wavelength conversion element in the headlight is not limited. Further, by adjusting the thickness ratio between the first and second phosphor layers of the wavelength conversion element, the chromaticity can be adjusted.

As described above, the wavelength conversion element according to this embodiment includes the first phosphor layer using as the first matrix zinc oxide which has a high refractive index, and the second phosphor layer using as the second matrix a material which has a refractive index that is lower than that of zinc oxide. By controlling the ratio between the thickness of the first phosphor layer and the thickness of the second phosphor layer, the chromaticities of the wavelength conversion element, the LED element, and the semiconductor laser light emitting device can be controlled even though the number of the kind of the phosphor is one and the amount of the phosphor is the same. Further, the controllability of the thickness of crystal growth of zinc oxide which forms the first matrix in the first phosphor layer is high, and thus, the controllability of the chromaticities of the wavelength conversion element, the LED element, and the semiconductor laser light emitting device is high. Further, the chromaticity of the wavelength conversion element can be controlled by the thickness of zinc oxide which is formed after the phosphor particle layer is formed in advance, and thus, the chromaticity of the wavelength conversion element can be measured in a step midway through the process of forming the first phosphor layer, and, based on the result, the chromaticity of the wavelength conversion element can be adjusted.

According to Embodiment 1, by using the thin film formed of zinc oxide in the c-axis orientation, spaces in the phosphor layer can be densely filled with the first matrix formed of zinc oxide columnar crystals in the c-axis orientation. In this manner, a grain boundary in zinc oxide in the direction of light emission in the first phosphor layer can be reduced, and at the same time, a void can be inhibited. Therefore, scattering of light which enters the wavelength conversion element can be inhibited, and light can be taken outside with efficiency.

According to Embodiment 2, by using the thin film formed of single crystalline zinc oxide, spaces in the phosphor particle layer can be densely filled with the first matrix formed of single crystalline zinc oxide which is epitaxially grown. In this manner, light scattering due to grain boundaries in zinc oxide in the first phosphor layer can be prevented, and at the same time, a void can be inhibited. Therefore, the wavelength conversion element according to this embodiment can take light outside with more efficiency.

Further, according to Embodiments 1 and 2, the first matrix is directly grown from the thin film, the first matrix and the thin film being formed of the same material. Therefore, the cohesion between the first phosphor layer and the substrate is high.

Further, according to Embodiments 1 and 2, the matrix in the second phosphor layer is formed of a material having a refractive index which is lower than that of zinc oxide. Therefore, when excitation light whose wavelength is to be converted is caused to be incident from the first phosphor layer side, excitation light and fluorescence from the first and second phosphor layers are emitted from the second phosphor layer. Therefore, the refractive index difference between the wavelength conversion element and an external environment becomes smaller compared with the case of zinc oxide, and the amount of light which is totally reflected at an interface between the second phosphor layer and the external environment can be reduced to realize a wavelength conversion element which can take light outside with more efficiency.

According to Embodiment 3, the wavelength conversion element has the above-mentioned characteristics, and thus, an LED element which has high optical output can be realized.

According to Embodiment 4, the LED element in which the wavelength conversion element according to this embodiment is formed on the semiconductor light emitting element or on the substrate of the semiconductor light emitting element via the crystal separation layer can be realized. According to this structure, even when the crystal structure of the semiconductor light emitting element or of the substrate of the semiconductor light emitting element prevents the c-axis orientation of zinc oxide, the thin film formed of zinc oxide in the c-axis orientation can be formed. In this manner, the first matrix in the first phosphor layer can be formed of zinc oxide in the c-axis orientation.

According to Embodiment 5, the crystal structure of the semiconductor light emitting element or of the substrate of the semiconductor light emitting element can be used to form the first matrix in the first phosphor layer of single crystalline zinc oxide. It is not necessary to additionally prepare an expensive single crystalline substrate, and thus, the cost of the LED element can be reduced.

According to Embodiment 6, the light emitting device in which the wavelength conversion element is excited by laser light emitted from the semiconductor laser chip can be formed. According to this structure, the directivity and the brightness of the semiconductor laser chip are higher than those of an LED chip. Further, in the wavelength conversion element according to this embodiment, light scattering in the phosphor can be inhibited, and thus, the semiconductor laser light emitting device according to this embodiment can realize a light source having high directivity or high brightness.

According to Embodiment 7, a highly reliable headlight is realized which has excellent resistance to heat and inhibits for a long time deterioration of the wavelength conversion element due to heat.

The wavelength conversion element, the LED element, and the semiconductor laser light emitting device according to the embodiments are described in detail using the following examples.

Example 1

(Formation of Thin Film of Zinc Oxide on Glass Substrate)

As the substrate, a soda glass substrate having a thickness of 1 mm was prepared. Electron beam deposition was used to form, on the glass substrate, a thin film of zinc oxide (ZnO underlayer) in the c-axis orientation, which had a thickness of 150 nm and which was doped with 3 at % of Ga. The substrate temperature when the film was formed was 180° C. After the film was formed, annealing was carried out in the atmosphere by raising the temperature from room temperature to 500° C. in 30 minutes, and keeping the temperature at 500° C. for 20 minutes.

(Formation of Phosphor Particle Layer)

A $Y_3Al_5O_{12}$:Ce (YAG:Ce) phosphor having a refractive index of 1.8 and an average particle diameter of 3 μm was used to prepare the phosphor dispersed solution. YAG:Ce phosphor particles (0.1 g), and phosphate ester (0.0003 g) and polyethyleneimine (0.0003 g) as dispersants were mixed with ethanol (30 ml) as a dispersion solvent, and an ultrasonic homogenizer was used to disperse the phosphor particles in the solvent.

The obtained phosphor dispersed solution was used to form, by electrophoresis, the phosphor particle layer on the substrate having the ZnO underlayer formed thereon. The conditions of depositing the phosphor particle layer were as follows. The ZnO underlayer was used as a cathode, a Pt electrode was used as an anode, the applied voltage was 100 V, and the time period of the voltage application was three minutes. After the phosphor particle layer was deposited, ethanol as the solvent was dried to complete the phosphor particle layer (having a thickness of about 17 μm). The weight per unit area of the phosphor was 3.3 mg/cm².

(Formation of First Phosphor Layer from Zinc Oxide)

As the method of solution growth of zinc oxide to be the first matrix, chemical bath deposition was used. As a zinc oxide growing solution, an aqueous solution in which zinc nitrate (0.1 mol/L) and hexamethylenetetramine (0.1 mol/L) were dissolved was prepared. The solution had a pH value of 5 to 7. The substrate having the phosphor particle layer formed thereon was immersed in the zinc oxide growing solution and the temperature of the zinc oxide growing solution was held at 90° C. to grow zinc oxide in a part of the spaces in the phosphor particle layer to from the first phosphor layer having a thickness of 16 μm. After this, the substrate was taken out, was cleaned with pure water, and was dried.

(Formation of Second Phosphor Layer from Glass)

The remaining part of the spaces in the phosphor particle layer after the first phosphor layer was formed was filled with glass to form the second phosphor layer having a thickness of 1 μm. A liquid glass raw material solution was prepared in which ethanol (4 ml), tetraethoxysilane (6 ml), deionized water (3 ml), and concentrated hydrochloric acid (1 ml) were mixed. The obtained liquid glass raw material solution was dropped onto the phosphor particle layer after the first phosphor layer was formed, and vacuuming was performed by a rotary pump to impregnate the remaining part of the spaces in the phosphor particle layer with the liquid glass raw material solution, and heating was carried out at 500° C. for two hours to convert the raw material solution into glass $SiO_2$.

(Mounting of Wavelength Conversion Element on LED Element and Evaluation of LED Element)

A plurality of blue LED chips having a light emission wavelength of 465 nm and having the same light emission intensity were prepared. The wavelength conversion element including the first phosphor layer and the second phosphor layer was cut by dicing so as to conform to the size of the support 61 to prepare an individualized wavelength conversion element. As illustrated in FIG. 6B, the blue LED chip was attached to the support 61 using the solder 64, and wiring was carried out between the electrodes 66 provided on the support 61 and the blue LED chip. Then, as illustrated in FIG. 6B, edges of the wavelength conversion element which was cut so as to conform to the size of the support 61 were fixed to the support 61 with an adhesive of a silicone resin so that the substrate side was the side of the surface 67 from which light from the LED element is emitted to complete the LED element illustrated in FIG. 6B. The completed LED element was attached to an integrating sphere and driven by a constant current of 20 mA, and the chromaticity and the light emission intensity of the entire radiant flux of the LED element were measured. The result is shown in Table 1.

(Evaluation of Refractive Index of Zinc Oxide and Glass)

On a glass substrate having the ZnO underlayer formed thereon, which was the same as that used in Example 1, the phosphor particle layer was not formed, and only a zinc oxide film was formed by crystal growth using solution growth which was similar to that used in Example 1. The refractive index of the zinc oxide film measured by spectroscopic ellipsometry was 2.0. Further, on a soda glass substrate having a thickness of 1 mm, only a glass film was formed by a method similar to that used in Example 1. The refractive index of the glass film measured by spectroscopic ellipsometry was 1.45.

Examples 2 to 5

The phosphor particle layer was formed by the same method as that used in Example 1 on the glass substrate having the ZnO underlayer formed thereon, which was the same as that in Example 1. The weight per unit area of the phosphor was 3.3 mg/cm². The LED element was completed by a method similar to that used in Example 1 except that the thickness of the first phosphor layer and the thickness of the second phosphor layer were changed, and the chromaticity and the light emission intensity of the entire radiant flux of the LED element were measured. The result is shown in Table 1.

Reference Example 1

A phosphor particle layer was formed by the same method as that used in Example 1 on the glass substrate having the ZnO underlayer formed thereon, which was the same as that in Example 1. The weight per unit area of the phosphor was 3.3 mg/cm². By a method similar to that used in Example 1, only a first phosphor layer was formed. Using the wavelength conversion element, by a method similar to that used in Example 1, an LED element was completed, and the chromaticity and the light emission intensity of the entire radiant flux of the LED element were measured. The result is shown in Table 1.

Comparative Example 1

A phosphor particle layer was formed by the same method as that used in Example 1 on the glass substrate having a thin film of zinc oxide formed thereon, which was the same as that in Example 1. The weight per unit area of the phosphor was 3.3 mg/cm². Spaces in the phosphor particle layer were filled with glass by a method similar to that used in Example 1 to form only a second phosphor layer. Using the wavelength conversion element, by a method similar to that used in Example 1, an LED element was completed, and the chromaticity and the light emission intensity of the entire radiant flux of the LED element were measured. The result is shown in Table 1.

Comparative Example 2

A phosphor particle layer was formed by the same method as that used in Example 1 on the glass substrate having the ZnO underlayer formed thereon, which was the same as that used in Example 1. The weight per unit area of the phosphor was 3.3 mg/cm². The wavelength conversion element was used to complete an LED element by a method similar to that used in Example 1, and the chromaticity and the light emission intensity of the entire radiant flux of the LED element were measured. The result is shown in Table 1.

Comparative Example 3

A glass substrate with ITO was prepared, in which an ITO (indium oxide doped with tin) film was formed by electron beam deposition on a soda glass substrate having a thickness of 1 mm. Similarly to the case of Example 1, a phosphor particle layer was formed on the glass substrate with ITO. The weight per unit area of the phosphor was 3.3 mg/cm².

Then, spaces in the phosphor particle layer were filled with zinc oxide by a sol-gel method. Zinc acetate dihydrate (Zn(CH$_3$COO)$_2$.2H$_2$O) was prepared as a zinc source, ethanol was prepared as a solvent, and diethanolamine (HN(CH$_2$CH$_2$OH)$_2$) was prepared as a stabilizer. A raw material solution for the sol-gel method was prepared, in which the mole ratios of diethanolamine and Zn$^{2+}$ were the same and 0.5 mol/L of zinc acetate was dissolved in ethanol. The obtained raw material solution for the sol-gel method was dropped onto the phosphor particle layer, and vacuuming was performed by a rotary pump to impregnate the spaces in the phosphor particle layer with the raw material solution. Then, heating was carried out at 400° C. for an hour to convert the raw material solution into zinc oxide. The wavelength conversion element was used to complete an LED element by a method similar to that used in Example 1, and the chromaticity and the light emission intensity of the entire radiant flux of the LED element were measured. The result is shown in Table 1.

Figure 12:
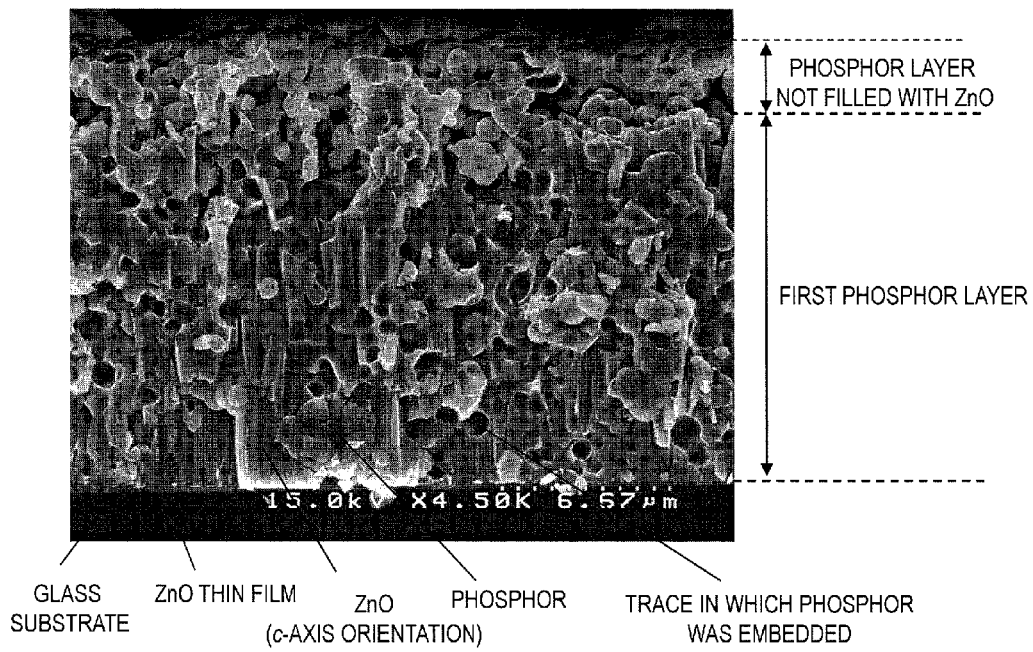
FIG. 12 is a photograph of an image observed under a scanning electron microscope (SEM) of a section of the wavelength conversion element in Example 2 in which portions up to a first phosphor layer are formed.

The thickness of the first phosphor layer was measured by observing under a SEM a section of the wavelength conversion element in which portions up to the first phosphor layer were formed. FIG. 12 is a photograph of an image observed under a SEM of a section of the wavelength conversion element in Example 2 in which the portions up to the first phosphor layer were formed. A sample is observed in a fracture cross section of the wavelength conversion element, and thus, places which look like round recesses in the observed image are traces in which the phosphor particles were embedded, and the phosphor is thought to be on a plane on an opposite side of the ruptured sample.

As shown in FIG. 12, it was confirmed that ZnO was formed upward in due order of succession from the ZnO underlayer formed below the phosphor particle layer in spaces in the phosphor particle layer. The thickness of the first phosphor layer was 14 μm, and the thickness of a portion of the wavelength conversion element which was not embedded in ZnO to be the thickness of the second phosphor layer was 3 μm. Further, as shown in FIG. 12, it was confirmed that the first phosphor layer was densely filled with zinc oxide.

Figure 13:
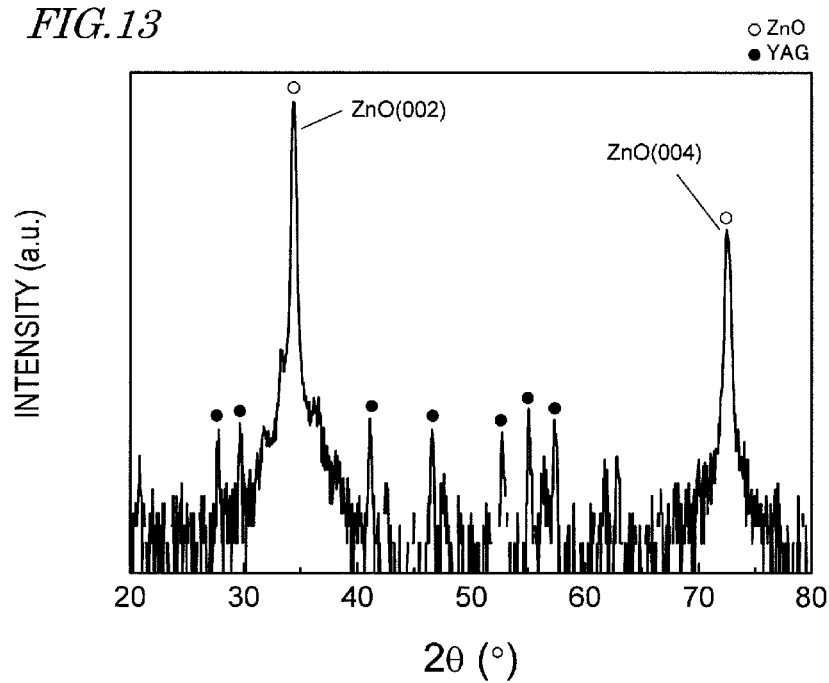
FIG. 13 is a graph showing the result of X-ray diffraction (XRD) measurement (2θ/ω scan) of a wavelength conversion element in Example 1.

FIG. 13 shows the result of XRD measurement (2θ/ω scan) of the wavelength conversion element of Example 1. The measurement can detect a crystal lattice plane in parallel with the substrate. As shown in FIG. 13, compared with diffraction peaks of the phosphor or zinc oxide other than in the c-plane, significantly high peaks of ZnO (002) and ZnO (004) were detected. This enabled confirmation that zinc oxide in the first phosphor layer of Example 1 had a significantly high degree of c-axis orientation. In this way, with regard to the result of XRD measurement (2θ/ω scan) of the wavelength conversion element, the diffraction peaks of zinc oxide in the c-plane are higher than diffraction peaks of zinc oxide other than in the c-plane, and thus, it can be confirmed that zinc oxide in this case is crystals in the c-axis orientation.

Figure 14:
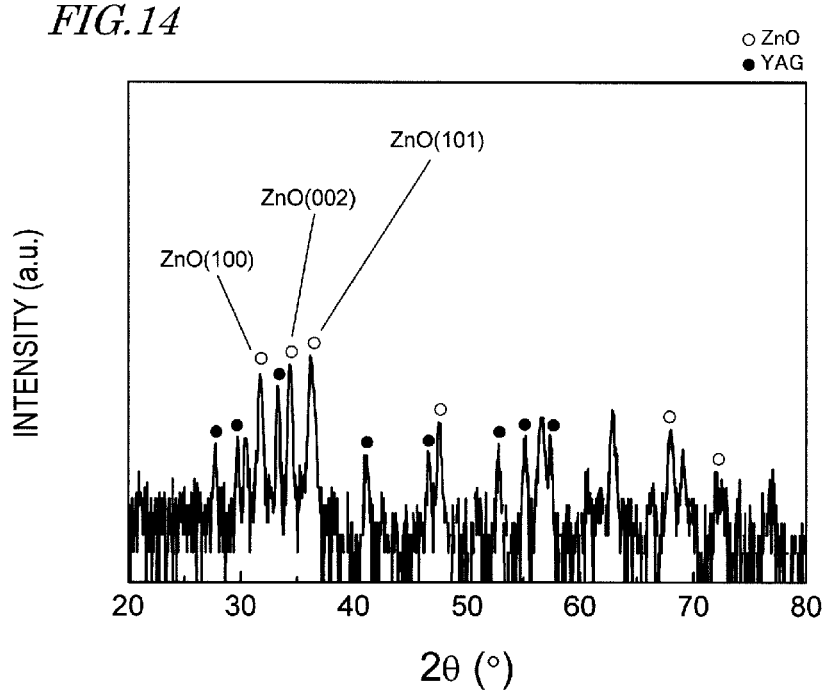
FIG. 14 is a graph showing the result of XRD measurement (2θ/ω scan) of a wavelength conversion element in Comparative Example 3.

FIG. 14 shows the result of XRD measurement (2θ/ω scan) of the wavelength conversion element of Comparative Example 3. As shown in FIG. 14, differently from the case of Example 1, the peak intensity of the phosphor and the peak intensity of zinc oxide were to similar extents. Further, peaks of ZnO (100), ZnO (002), and ZnO (101) were detected and the peak intensities thereof were to similar extents. This enabled confirmation that zinc oxide of the wavelength conversion element of Comparative Example 3 was in random orientations.

Table 1 covers the result of the chromaticity and the light emission intensities of the LED elements.

TABLE 1

| Sample | Structure | Thickness of first phosphor layer (μm) | Thickness of second phosphor layer (μm) | Ratio of first phosphor layer in phosphor layer (%) | Chromaticity x | Chromaticity y | Light emission intensity |
|---|---|---|---|---|---|---|---|
| Reference Example 1 | First phosphor layer only | 17 | 0 | 100 | 0.23 | 0.24 | 120 |
| Example 1 | First phosphor | 16 | 1 | 94.1 | 0.24 | 0.25 | 119 |

TABLE 1-continued

| Sample | Structure | Thickness of first phosphor layer (μm) | Thickness of second phosphor layer (μm) | Ratio of first phosphor layer in phosphor layer (%) | Chromaticity x | Chromaticity y | Light emission intensity |
|---|---|---|---|---|---|---|---|
| Example 2 | layer + second phosphor layer | 14 | 3 | 82.4 | 0.24 | 0.26 | 116 |
| Example 3 | | 11 | 6 | 64.7 | 0.25 | 0.27 | 113 |
| Example 4 | | 6 | 11 | 35.3 | 0.26 | 0.29 | 107 |
| Example 5 | | 3 | 14 | 17.6 | 0.27 | 0.31 | 104 |
| Comparative Example 1 | Second phosphor layer only | 0 | 17 | 0 | 0.28 | 0.32 | 100 (reference) |
| Comparative Example 2 | Phosphor particle layer only | — | — | — | 0.36 | 0.45 | 60 |
| Comparative Example 3 | Phosphor particle layer + zinc oxide in random orientations | — | — | — | 0.28 | 0.32 | 73 |

In Table 1, for the sake of easy understanding, the examples, the comparative examples, and the reference example are listed in descending order of thickness of the first phosphor layer. The weight per unit area of the phosphor was set to be equal in all of the samples. The light emission intensities of the LED elements other than the LED element of Comparative Example 1 are expressed supposing that the light emission intensity of the LED element of Comparative Example 1 is 100.

In the LED element of Comparative Example 1 having only the second phosphor layer filled with glass, certain white chromaticity (x=0.28, y=0.32) was obtained. In comparison with that, in the cases of Example 1 to Example 5, even though the number of the kind of the phosphor was one and the amount of the phosphor was the same similarly to the case of Comparative Example 1, by controlling the ratio between the thickness of the first phosphor layer and the thickness of the second phosphor layer, the chromaticity of the LED element was able to be adjusted with high accuracy from the chromaticity of a bluish white color of Example 1 (x=0.24, y=0.25) to the chromaticity of a white color of Example 5 (x=0.27, y=0.31). Based on the result of the experiment, even though nonuniformity of blue light due to the LED element or nonuniformity of emitted yellow light due to nonuniformity of the phosphor is caused, by controlling the ratio between the thickness of the first phosphor layer and the thickness of the second phosphor layer, the ratio between blue light from the LED chip and yellow light emitted from the phosphor is controlled, and an LED element having desired chromaticity can be obtained in a range in which the chromaticity of the LED element can be adjusted.

A range in which the chromaticity of the LED element can be adjusted means, in this example, the range from the chromaticity (x, y) of the LED element which is formed of only the first phosphor layer in Reference Example to the chromaticity (x, y) of the LED element which is formed of only the second phosphor layer in Comparative Example 1, and, in accordance with the ratio between the thickness of the first phosphor layer and the thickness of the second phosphor layer, the chromaticity of the LED element can be adjusted in a continuous manner.

Further, in Example 1 to Example 5, the light emission intensity which was higher than that of Comparative Example 1 was obtained. This is because the inside of the first phosphor layer was densely filled with zinc oxide columnar crystals in the c-axis orientation having a refractive index which was higher than that of glass.

The light emission intensity of the LED element of Comparative Example 2 using the wavelength conversion element in which the phosphor particles were just accumulated on the substrate was 60. The light emission intensity of the LED element of Comparative Example 3 using the wavelength conversion element in which the inside of the phosphor particle layer was filled with zinc oxide in random orientations was 73. In Comparative Example 3, the obtained light emission intensity was 1.2 times as high as that in the case of Comparative Example 2, but, in Comparative Example 3, the obtained light emission intensity was lower than those of Examples 1 to 5 and Comparative Example 1. This is because, when the inside of the phosphor particle layer is filled with zinc oxide in random orientations, a large number of grain boundaries of zinc oxide exist in the direction of light emission, and thus, light scattering in the wavelength conversion element occurs to a large extent.

Figure 15A:
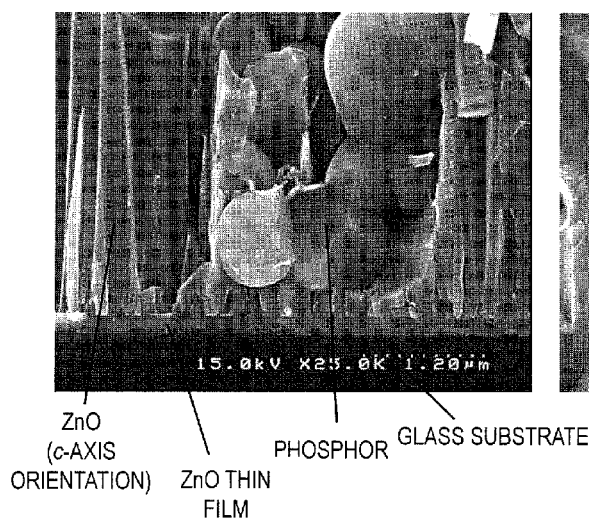
FIG. 15A is a photograph of an image observed under a SEM of a section of a first phosphor layer around an interface with a substrate in Example 1.
Figure 15B:
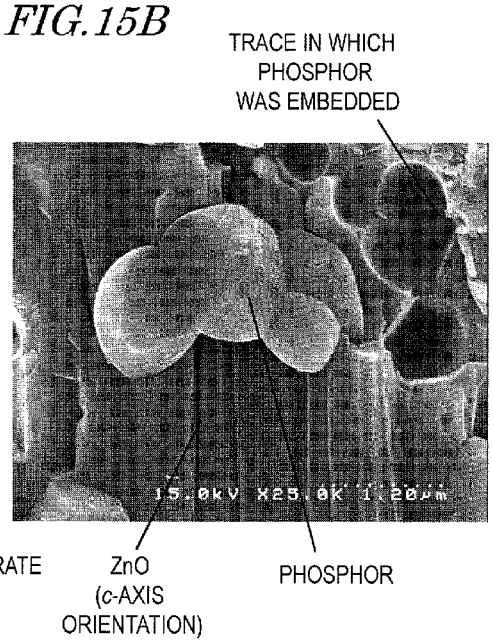
FIG. 15B is a photograph of an image observed under a SEM of a section of the first phosphor layer around the center in Example 1.

FIGS. 15A and 15B are images observed under a SEM of a section of the wavelength conversion element of Example 1. Samples are observed in a fracture cross-section of the wavelength conversion element, and thus, places which look like round recesses in the observed image are traces in which the phosphor particles were embedded, and the phosphor is thought to be on a plane on an opposite side of the ruptured samples. FIG. 15A shows a portion around an interface of the first phosphor layer with the substrate, and FIG. 15B shows a center portion of the first phosphor layer. As is clear from FIGS. 15A and 15B, the inside of the first phosphor layer is densely filled with zinc oxide. Further, vertical grain boundaries are observed in zinc oxide in the first phosphor layer. This shows that zinc oxide grew into columnar crystals by solution growth. From FIG. 15A, it can be seen that zinc oxide was held in close contact with the ZnO underlayer, and zinc oxide was grown from the ZnO underlayer. From FIG. 15B, a state in which zinc oxide columnar crystals fill space around the phosphor particles can be seen. Zinc oxide columnar crystals having only a small number of grain boundaries in the direction of light emission were able to be arranged, and thus, light scattering in the first phosphor layer was able to be inhibited.

Figure 16:
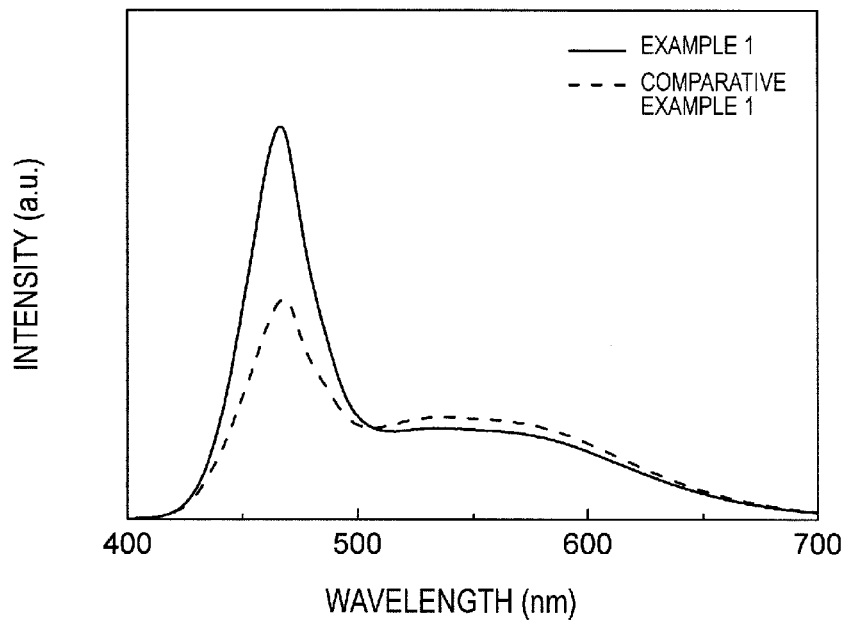
FIG. 16 is a graph showing the result of measurement of emission spectra of LED elements in Example 1 and Comparative Example 1, respectively.

FIG. 16 shows emission spectra of the LED elements of Example 1 and Comparative Example 1. In Example 1, the inside of the phosphor particle layer was able to be densely filled with zinc oxide columnar crystals, and thus, light scattering in the wavelength conversion element was able to be inhibited more than in the case of Comparative Example 1, and blue light from the LED chip was able to be taken outside of the LED element with efficiency. As shown in FIG. 16, even though the same phosphor was used and the amount of the phosphor was the same, the ratio between blue light from the LED chip and yellow light emitted from the phosphor can be changed, and thus, according to Example 1, a wavelength conversion element and an LED element that have chromaticities different from those of Comparative Example 1 can be realized.

Example 6

With regard to the film forming conditions in forming the ZnO underlayer on the glass substrate, the substrate was not heated in the film formation, and annealing was not carried out after the film formation. An LED element was completed by a method similar to that used in Example 1 except for those conditions, and the light emission intensity of the entire radiant flux of the LED element was measured. The result is shown in Table 2. Note that, the weight per unit area of the phosphor was 3.3 mg/cm$^2$.

Example 7

With regard to the film forming conditions in forming the ZnO underlayer on the glass substrate, the substrate temperature was set to 180° C. in the film formation, and annealing was not carried out after the film formation. An LED element was completed by a method similar to that used in Example 1 except for those conditions, and the light emission intensity of the entire radiant flux of the LED element was measured. The result is shown in Table 2. Note that, the weight per unit area of the phosphor was 3.3 mg/cm$^2$.

Example 8

With regard to the film forming conditions in forming the ZnO underlayer on the glass substrate, the substrate temperature was set to 180° C. in the film formation. Further, after the film formation, annealing was carried out in the atmosphere by raising the temperature from room temperature to 300° C. in 30 minutes, and keeping the temperature at 300° C. for 20 minutes. An LED element was completed by a method similar to that used in Example 1 except for those conditions, and the light emission intensity of the entire radiant flux from the LED element was measured. The result is shown in Table 2. Note that, the weight per unit area of the phosphor was 3.3 mg/cm$^2$.

The tilt (tilt of a crystal axis) of ZnO (002) of the wavelength conversion element of Example 1 was evaluated by an X-ray rocking curve method (ω scan). In this measurement, by fixing 2θ (location of a detector) and rotating only the sample, the distribution of the crystal orientations is measured, which is an index of the extent of the uniformity of the crystal orientation. With this, the tilt of the c-axis of zinc oxide was evaluated. The full width at half maximum of the rocking curve of ZnO (002) in Example 1 was 2.7°. This is defined as the tilt of the c-axis of zinc oxide in the first phosphor layer.

The full widths at half maximum of the X-ray rocking curves of ZnO (002) of the wavelength conversion elements of Example 6 to Example 8 were measured in a similar method. The result of those measurements is shown in Table 2. Further, the full widths at half maximum of the X-ray rocking curves of the ZnO (002) of the ZnO underlayer on the glass substrates in Examples 1 and 6 to 8 were measured in a similar method. This is defined as the tilt of the c-axis of the ZnO underlayer. The result of those measurements is shown in Table 2.

Note that, based on the result of XRD measurement (2θ/ω scan) of the ZnO underlayers on the glass substrates and of the wavelength conversion elements of Examples 1 and 6 to 8, it was able to be confirmed that, in all of those cases, ZnO was in the c-axis orientation.

Table 2 covers the result of the tilts of the c-axes of zinc oxide in the wavelength conversion elements and of the light emission intensities of the LED elements.

TABLE 2

| Sample | Tilt of c-axis of zinc oxide thin film | Tilt of c-axis of zinc oxide in first phosphor layer | Light emission intensity |
|---|---|---|---|
| Example 6 | 5.5 | 5.0 | 94 |
| Example 7 | 4.5 | 4.0 | 111 |
| Example 8 | 4.2 | 2.9 | 116 |
| Example 1 | 4.0 | 2.7 | 119 |
| Comparative Example 1 | — | — | 100 (reference) |

The weight per unit area of the phosphor was set equal in all of the samples. In Table 2, for the sake of easy understanding, the examples are listed in descending order of tilt of the c-axis of zinc oxide in the first phosphor layer. The light emission intensities of the LED elements other than the LED element of Comparative Example 1 are expressed supposing that the light emission intensity of the LED element of Comparative Example 1 is 100.

A correlation is observed between the tilt of the c-axis of zinc oxide in the first phosphor layer and the light emission intensity of the LED element. As the tilt of the c-axis of zinc oxide in the first phosphor layer became smaller, the light emission intensity of the LED element was improved. Further, a correlation is also observed between the tilt of the c-axis of zinc oxide in the first phosphor layer and the tilt of the c-axis of the ZnO underlayer. As the tilt of the c-axis of the ZnO underlayer became smaller, the tilt of the c-axis of ZnO in the first phosphor layer became smaller. This is thought to be because zinc oxide in the phosphor particle layer grew along the c-axis direction of the ZnO underlayer with the ZnO underlayer being the seed crystal.

As shown in Table 2, when the tilt of the c-axis of zinc oxide in the first phosphor layer was 4.0° or less, the light emission intensity was improved compared with the light emission intensity of the LED element of Comparative Example 1 using only the second phosphor layer. Further, it was found that, in order to cause the tilt of the c-axis of zinc oxide in the first phosphor layer to be 4.0° or less, it was necessary to set the tilt of the c-axis of the ZnO underlayer to 4.5° or less.

Further, according to Example 8, the tilt of the c-axis of zinc oxide in the first phosphor layer may be 2.9° or less, and, in that case, the tilt of the c-axis of the ZnO underlayer may be 4.2° or less. Further, according to Example 1, the tilt of the c-axis of ZnO in the first phosphor layer may be 2.7° or less, and in that case, the tilt of the c-axis of the ZnO underlayer may be 4.0° or less.

Figure 17A:
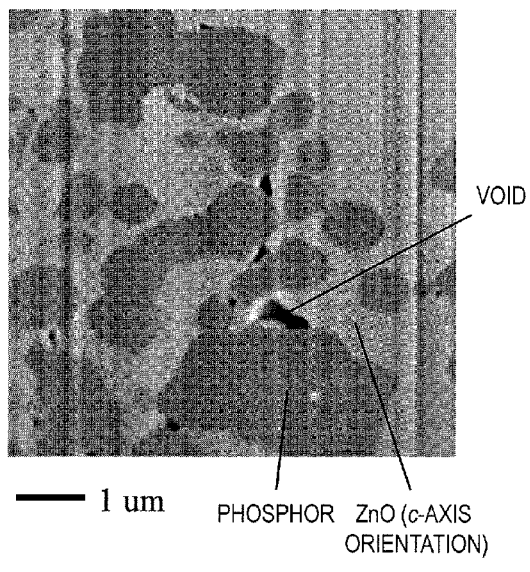
FIGS. 17A and 17B are photographs of an image observed under a SEM of a section of a wavelength conversion element which is processed using a focused ion beam (FIB).
Figure 17B:
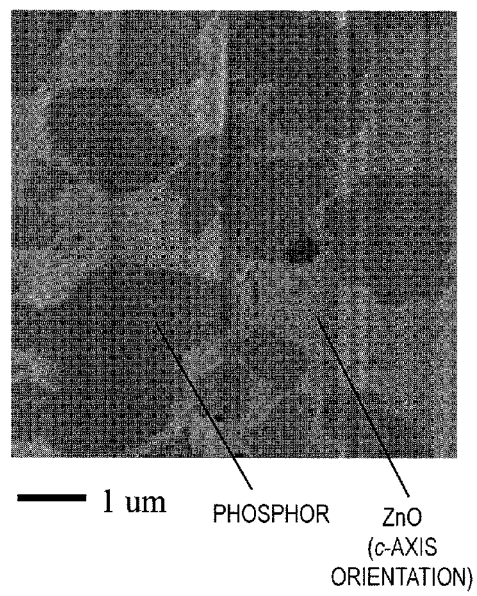

In order to observe in more detail the voids in the first phosphor layer, a focused ion beam (FIB) was used to process a section of the wavelength conversion element and observation was made under a SEM. FIG. 17A is an image observed under a SEM of the first phosphor layer in Example 6, and FIG. 17B is an image observed under a SEM of the first phosphor layer in Example 1. As shown in FIG. 17A, in the first phosphor layer of Example 6, a void was observed above a phosphor particle. As is clear from FIG. 17B, the number of the voids in the first phosphor layer in Example 1 was smaller than that in Example 6, and it was able to be confirmed that the voids were inhibited.

Figure 18A:
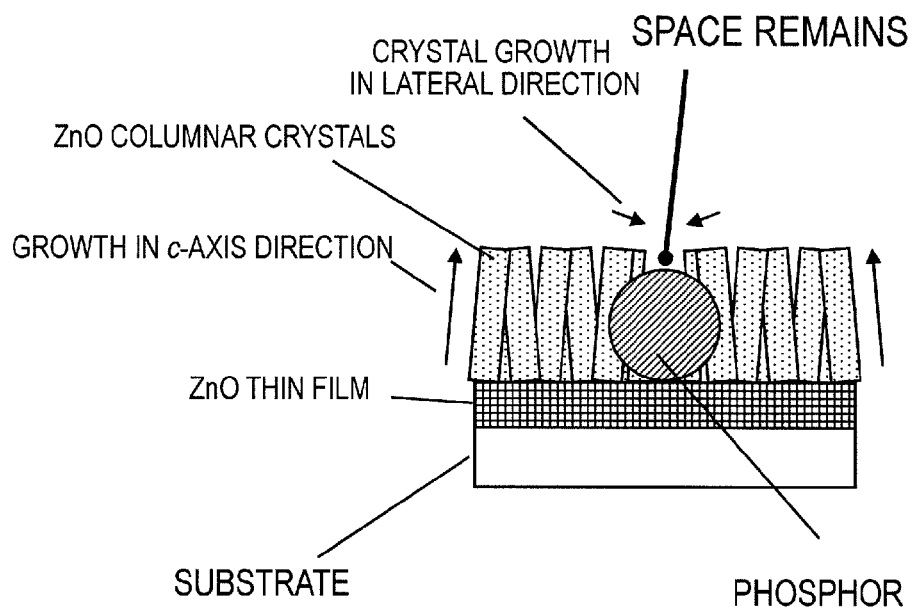
FIGS. 18A and 18B are sectional views illustrating a crystal growth process of zinc oxide using solution growth in a phosphor particle layer.
Figure 18B:
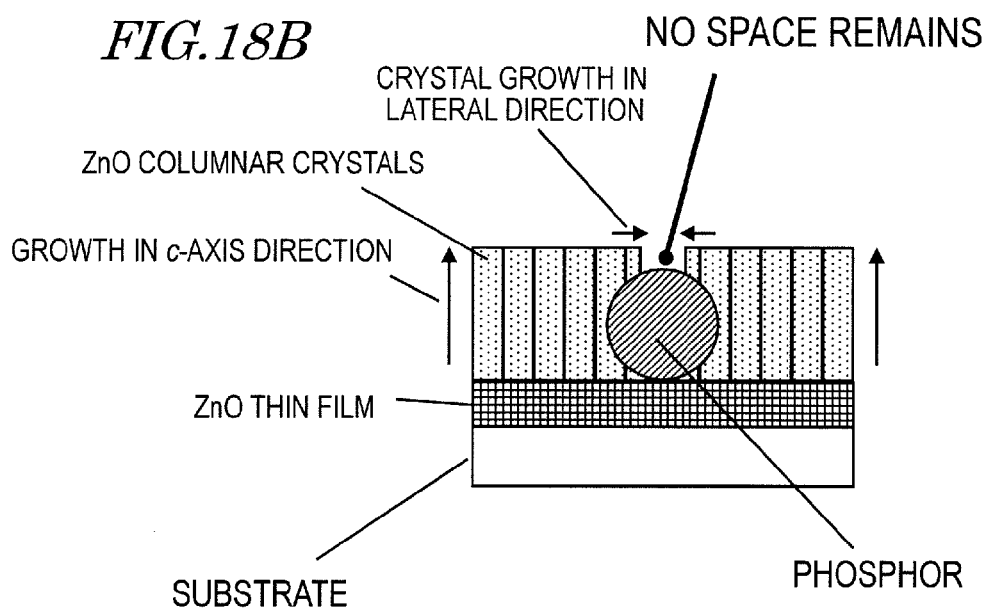

The detailed reason why there is a correlation between the tilt of the c-axis of zinc oxide in the first phosphor layer and the light emission intensity of the LED element as described above is unknown, but the following reason can be thought. FIGS. 18A and 18B are schematic views in the process of embedding the phosphor particles in zinc oxide by solution growth. FIG. 18A illustrates a case in which the tilt of the c-axis of zinc oxide in the first phosphor layer is large, and FIG. 18B illustrates a case in which the tilt of the c-axis of zinc oxide in the first phosphor layer is small. For the sake of easy understanding, in FIGS. 18A and 18B, the number of the phosphor particles is simplified to be one.

In growing zinc oxide by solution growth, the phosphor cannot be a seed crystal, and zinc oxide does not directly grow from phosphor particles. Zinc oxide in the first phosphor layer grows from the ZnO underlayer in the c-axis direction. When zinc oxide which grows in the c-axis direction from below the phosphor particles hits the phosphor particles, the crystal growth thereof stops there. Zinc oxide grows in a horizontal direction (lateral direction) above the phosphor particles to embed the phosphor particles.

With thought being given in this way, when the tilt of the c-axis of the ZnO underlayer is large, the tilt of the c-axis of zinc oxide in the first phosphor layer is large. When the tilt of the c-axis of zinc oxide in the first phosphor layer is large, the direction of the crystal growth in the lateral direction of zinc oxide is nonuniform, and thus, when the phosphor particles are embedded in zinc oxide, voids remain above the phosphor particles.

When the tilt of the c-axis of the ZnO underlayer is small, the tilt of the c-axis of zinc oxide in the first phosphor layer is small. When the tilt of the c-axis of zinc oxide in the first phosphor layer is small, the direction of the crystal growth in the lateral direction of zinc oxide is uniform, and thus, when the phosphor particles are embedded in zinc oxide, no void remains above the phosphor particles. In this way, by decreasing the tilt of the c-axis of zinc oxide which fills the spaces in the phosphor particle layer, the voids in the first phosphor layer were able to be inhibited.

Example 9

As the substrate, a c-plane sapphire substrate having a single crystalline GaN thin film formed thereon was prepared. The thickness of the sapphire substrate was 0.43 mm and the thickness of the GaN thin film was 5 μm. A single crystalline ZnO underlayer was formed on the GaN/sapphire substrate by solution growth. As the solution growth of zinc oxide, chemical bath deposition was used. As the zinc oxide growing solution, an aqueous solution in which zinc nitrate (0.1 mol/L) and hexamethylene tetramine (0.1 mol/L) were dissolved was prepared. The solution had a pH value of 5 to 7. The above-mentioned substrate was immersed in the zinc oxide growing solution and the temperature of the zinc oxide growing solution was held at 90° C. to grow single crystalline zinc oxide by 0.7 μm on the GaN thin film/sapphire substrate. After this, the substrate was taken out, was cleaned with pure water, and was dried.

After that, an LED element was completed by a method similar to that used in Example 1, and the light emission intensity of the entire radiant flux of the LED element was measured. The result is shown in Table 3. Note that, the weight per unit area of the phosphor was 3.3 mg/cm$^2$.

Comparative Example 4

As the substrate, a c-plane sapphire substrate having a thickness of 0.43 mm was prepared. Then, an LED element was completed by a method similar to that used in Comparative Example 1, and the light emission intensity of the entire radiant flux of the LED element was measured. The result is shown in Table 3. Note that, the weight per unit area of the phosphor was 3.3 mg/cm$^2$.

Figure 19:
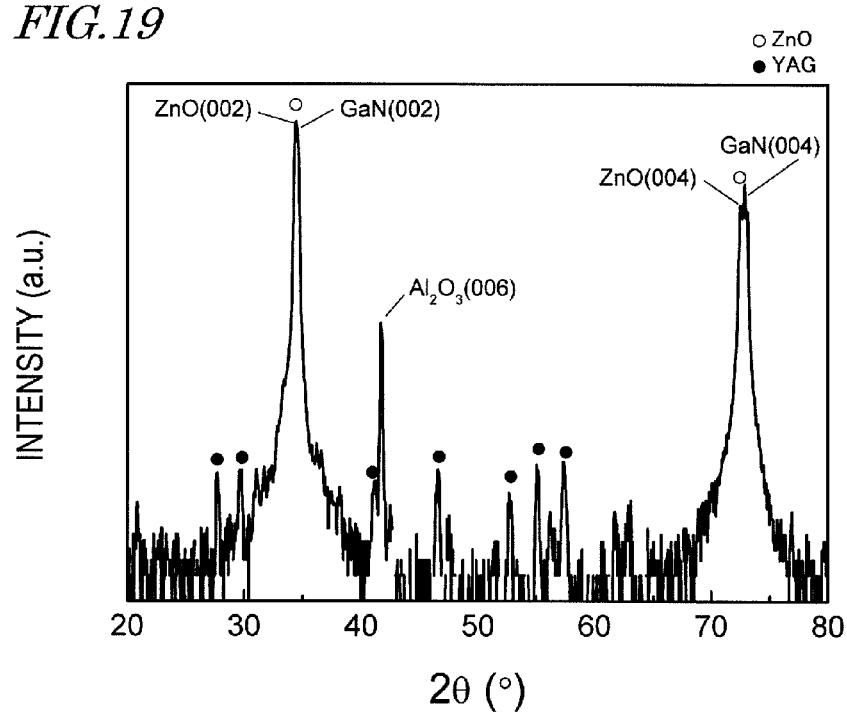
FIG. 19 is a graph showing the result of XRD measurement (2θ/ω scan) of a wavelength conversion element in Example 9.

FIG. 19 shows the result of XRD measurement (2θ/ω scan) of the wavelength conversion element of Example 9. As shown in FIG. 19, compared with diffraction peaks of the phosphor or zinc oxide other than in the c-plane, significantly high peaks of ZnO (002) and ZnO (004) were detected. This enabled confirmation that zinc oxide in the first phosphor layer of Example 9 had a significantly high degree of c-axis orientation. However, as shown in FIG. 19, zinc oxide and GaN have the same crystal structure and similar lattice constants, and thus, the peaks of zinc oxide and GaN are in proximity to each other with regard to both (002) and (004), and clear separation thereof is difficult.

In this case, the result of XRD measurement (2θ/ω scan) on a larger angle side (123° to 129°) of the wavelength conversion element of Example 9 shows the peaks of ZnO (006) and of GaN (006), which were detected in a clearly separate state.

The tilt (tilt of a crystal axis) of ZnO (006) of the wavelength conversion element of Example 9 was evaluated by an X-ray rocking curve method (ω scan). With this, the tilt of the c-axis of zinc oxide was evaluated. The full width at half maximum of the X-ray rocking curve of ZnO (006) of Example 9 was 0.2°. This is defined as the tilt of the c-axis of zinc oxide in the first phosphor layer. It was able to be confirmed that the tilt of the crystal axis of the c-axis of zinc oxide of Example 9 was significantly small compared with that of zinc oxide of the columnar crystals of Example 1. Further, in a similar method, the full width at half maximum of the X-ray rocking curve of ZnO (006) of the single crystalline ZnO underlayer on the GaN/sapphire substrate of Example 9 was measured. The full width at half maximum was 0.2°. This is defined as the tilt of the c-axis of the ZnO underlayer. It was able to be confirmed that the tilt of the c-axis of the ZnO underlayer of Example 9 was also significantly small compared with that of the ZnO underlayer of Example 1. Note that, based on the result of XRD measurement (2θ/ω scan) of the single crystalline ZnO underlayer on the GaN/sapphire substrate of Example 9, it was able to be confirmed that zinc oxide was in the c-axis orientation.

Figure 20:
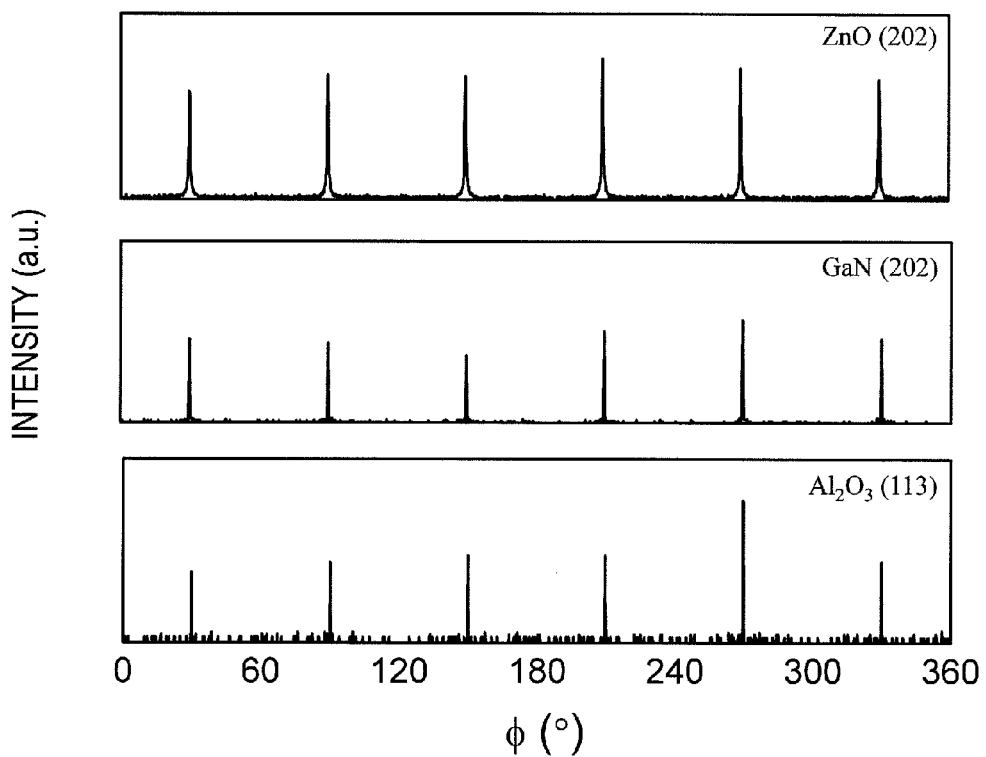
FIG. 20 is a graph showing the result of XRD measurement (Φ scan) of the wavelength conversion element in Example 9.

FIG. 20 shows the result of XRD measurement (Φ scan) of the wavelength conversion element of Example 9. In this measurement, by rotating the samples in an in-plane direction by 360°, the crystal orientation in the plane can be evaluated. Evaluation of ZnO (202), GaN (202), and Al$_2$O$_3$ (113) was made. As shown in FIG. 20, a pattern of hexagonal symmetry of zinc oxide appeared, and thus, it was confirmed that zinc oxide in the wavelength conversion element was a single crystal in a uniform crystal orientation. Further, all the locations of the peaks of Al$_2$O$_3$ of the sapphire substrate, the locations of the peaks of GaN, and the locations of the peaks of zinc oxide were coincident with one another, and thus, the crystal orientation of zinc oxide exhibited an epitaxial relationship with the crystal orientations of the sapphire substrate and of the GaN thin film. It was able to be confirmed that zinc oxide was epitaxially grown with respect to the sapphire substrate and the GaN thin film.

Figure 21:
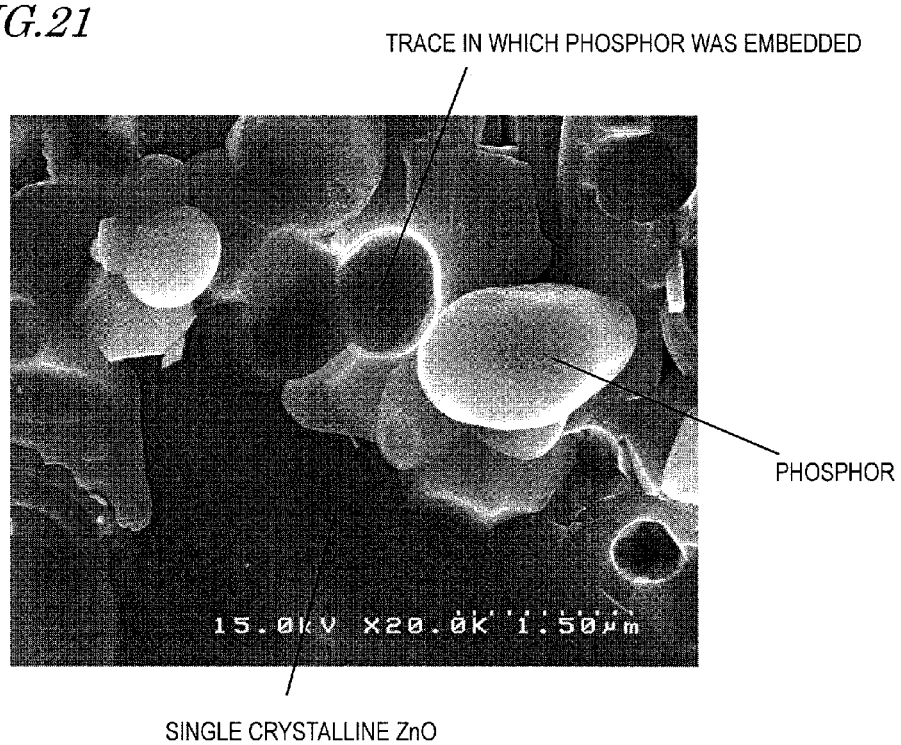
FIG. 21 is a photograph of an image observed under a SEM of a section of the first phosphor layer around the center in Example 9.

FIG. 21 is an enlarged image of the phosphor layer around the center in an image observed under a SEM of a section of the ruptured wavelength conversion element of Example 9. A sample is observed in a fracture cross-section of the ruptured wavelength conversion element, and thus, places which look like round recesses in the observed image are traces in which the phosphor particles were embedded, and the phosphor is thought to be on a plane on an opposite side of the ruptured sample. As is clear from FIG. 21, it was able to be confirmed that the inside of the first phosphor layer was densely filled with zinc oxide. Further, differently from the case of zinc oxide of Example 1, no grain boundary was observed with regard to zinc oxide of Example 9. This is because zinc oxide was epitaxially grown from the single crystalline ZnO underlayer, and thus, the inside of the wavelength conversion element was able to be densely filled with single crystalline zinc oxide having no grain boundary.

Table 3 covers the result of the light emission intensities of the LED elements of Example 9 and Comparative Example 4.

TABLE 3

| Sample | Structure | Light emission intensity |
|---|---|---|
| Example 9 | First phosphor layer + Second phosphor layer | 126 |
| Comparative Example 4 | Second phosphor layer only | 100 (reference) |

The weight per unit area of the phosphor was set equal in all of the samples. The light emission intensity of the LED element other than the LED element of Comparative Example 4 is expressed supposing that the light emission intensity of the LED element of Comparative Example 4 is 100. The light emission intensity of Example 9 was 126, and the obtained light emission intensity was 1.26 times as high as that of the LED element of Comparative Example 4 using only the second phosphor layer. The light emission intensity in the case of Example 1 in which the inside of the wavelength conversion element was filled with zinc oxide columnar crystals in the c-axis orientation was 1.19 times as high as that in the case of Comparative Example 1. When those results are compared, in Example 9 in which the spaces among the phosphor particles were filled with single crystalline zinc oxide, the light emission intensity was improved more than in Example 1 in which the inside of the wavelength conversion element was filled with zinc oxide columnar crystals. This is because the inside of the first phosphor layer was able to be densely filled with single crystalline zinc oxide having no grain boundary. Therefore, light scattering in the wavelength conversion element was able to be inhibited more than in the case of the wavelength conversion element filled with zinc oxide columnar crystals.

Figure 22:
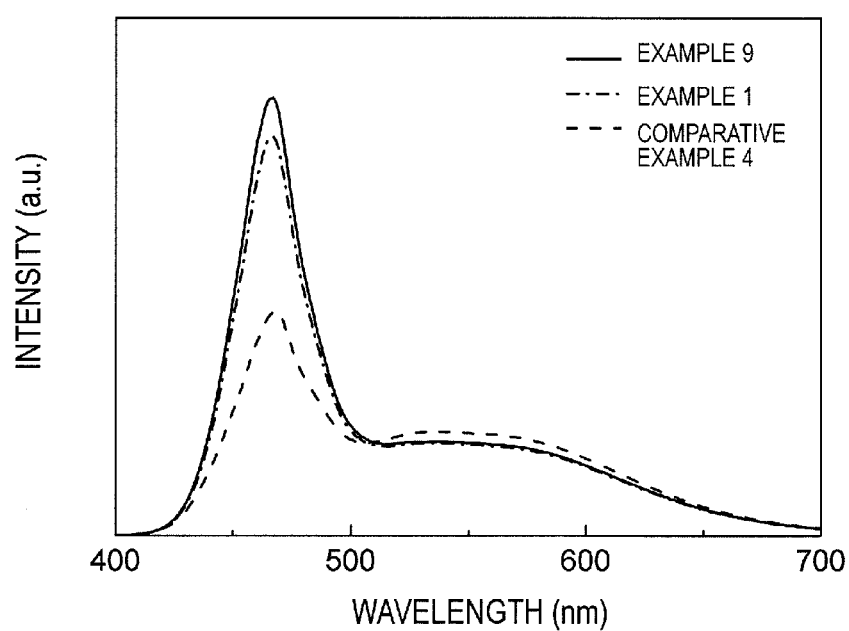
FIG. 22 is a graph showing the result of measurement of emission spectra of LED elements in Example 9, Example 1, and Comparative Example 4, respectively.

FIG. 22 shows emission spectra of the LED elements of Example 9, Example 1, and Comparative Example 4. As shown in FIG. 22, in Example 9, the inside of the phosphor particle layer was able to be densely filled with single crystalline zinc oxide having no grain boundary, and thus, light scattering in the phosphor layer was able to be inhibited more than in the case of Example 4 and Comparative Example 1, and blue light from the LED chip was able to be taken outside of the LED element with efficiency. As shown in FIG. 22, even though the same phosphor was used and the amount of the phosphor was the same, the ratio between blue light from the LED chip and yellow light emitted from the phosphor can be changed, and thus, according to Example 9, a wavelength conversion element and an LED element that have the chromaticities different from those of Comparative Example 4 can be realized.

Example 10

A plurality of blue LED chips having a light emission wavelength of 446 nm and having the same light emission intensity were prepared. Instead of the YAG:Ce phosphor in Example 1, a β-SiAlON:Eu phosphor having a refractive index of 1.9 and an average particle diameter of 6 μm was used to form the phosphor particle layer by a method similar to that used in Example 1. The thickness of the phosphor particle layer was about 30 μm, and the weight per unit area of the phosphor was 5.0 mg/cm$^2$. Then, by a method similar to that used in Example 1, the first phosphor layer having a thickness of 28 μm and the second phosphor layer having a thickness of 2 μm were formed. Further, by a method similar to that used in Example 1, the LED element was completed, and the light emission intensity of the entire radiant flux of the LED element was measured. The result is shown in Table 4.

Comparative Example 5

Similarly to the case of Example 10, blue LED chips having a light emission wavelength of 446 nm and having the same light emission intensity and a β-SiAlON:Eu phosphor having a refractive index of 1.9 and an average particle diameter of 6 μm were used to form a second phosphor layer having a thickness of 30 μm by a method similar to that used in Comparative Example 1. Note that, the weight per unit area of the phosphor was 5.0 mg/cm$^2$. Further, an LED element was completed by a method similar to that used in Comparative Example 1, and the light emission intensity of the entire radiant flux of the LED element was measured. The result is shown in Table 4.

By a method similar to that used in Example 1, XRD measurement (2θ/ω scan) of the wavelength conversion element of Example 10 was performed. Compared with diffraction peaks of the phosphor or zinc oxide other than in the c-plane, significantly high peaks of ZnO (002) and ZnO (004) were detected. This enabled confirmation that zinc oxide in the wavelength conversion element of Example 10 had a significantly high degree of c-axis orientation. Further, by a method similar to that used in Example 1, the full width at half maximum of the X-ray rocking curve of ZnO (002) of the wavelength conversion element of Example 10 was measured. The full width at half maximum of the X-ray rocking curve of ZnO (002) of Example 10 was 2.7°.

Figure 23:
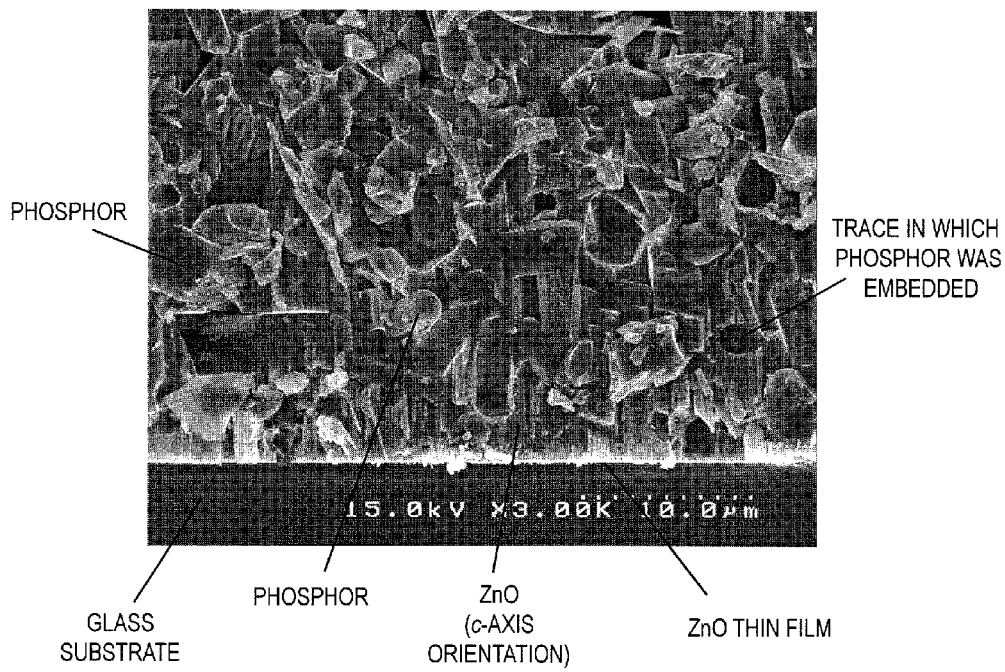
FIG. 23 is a photograph of an image observed under a SEM of a section of a first phosphor layer around an interface with a substrate in Example 10.

FIG. 23 is an image observed under a SEM of a section of the first phosphor layer around an interface with the substrate in the raptured wavelength conversion element of Example 10. A sample is observed in a fracture cross-section of the wavelength conversion element, and thus, places which look like recesses in the observed image are traces in which the phosphor particles were embedded, and the phosphor is thought to be on a plane on an opposite side of the ruptured sample. As is clear from FIG. 23, the inside of the first phosphor layer is densely filled with zinc oxide.

Further, vertical grain boundaries are observed in zinc oxide in the first phosphor layer. This shows that zinc oxide grew into columnar crystals by solution growth. From FIG. 23, it can be seen a state in which zinc oxide is held in close contact with the ZnO underlayer, and zinc oxide is crystal grown from the ZnO underlayer so that zinc oxide columnar crystals fill space around the phosphor particles. This enabled confirmation that, even when β-SiAlON was used as the phosphor, zinc oxide columnar crystals having only a small number of grain boundaries were able to be arranged in the direction of light emission.

Table 4 covers the result of the light emission intensities of the LED elements of Example 10 and Comparative Example 5.

TABLE 4

| Sample | Structure | Thickness of first phosphor layer (μm) | Thickness of second phosphor layer (μm) | Ratio of first phosphor layer in phosphor layer (%) | Chromaticity x | Chromaticity y | Light emission intensity |
|---|---|---|---|---|---|---|---|
| Example 10 | First phosphor layer + second phosphor layer | 28 | 2 | 93.3 | 0.20 | 0.22 | 119 |
| Comparative Example 5 | Second phosphor layer only | 0 | 30 | 0 | 0.22 | 0.28 | 100 (reference) |

The weight per unit area of the phosphor was set equal in the two samples. The light emission intensity of the LED element other than the LED element of Comparative Example 5 is expressed supposing that the light emission intensity of the LED element of Comparative Example 5 is 100.

In the LED element of Comparative Example 5 having only the second phosphor layer filled with glass, chromaticity of (x=0.22, y=0.28) was obtained. In comparison with that, in the case of Example 10, even though the number of the kind of the phosphor was one and the amount of the phosphor was the same similarly to the case of Comparative Example 5, chromaticity of (x=0.20, y=0.22) was obtained. In this way, even though the same phosphor was used and the amount of the phosphor was the same, the ratio between excitation light from the LED chip and fluorescence from the phosphor can be changed, and thus, according to Example 10, a wavelength conversion element and an LED element whose chromaticities were different from those of Comparative Example 5 were able to be realized.

The light emission intensity of Example 10 was 119, and the obtained light emission intensity was 1.19 times as high as that of the LED element of Comparative Example 5 including only the second phosphor layer. This is because the inside of the first phosphor layer was able to be densely filled with zinc oxide columnar crystals having only a small number of grain boundaries in the c-axis orientation. Therefore, light scattering in the wavelength conversion element was able to be inhibited.

Figure 24:
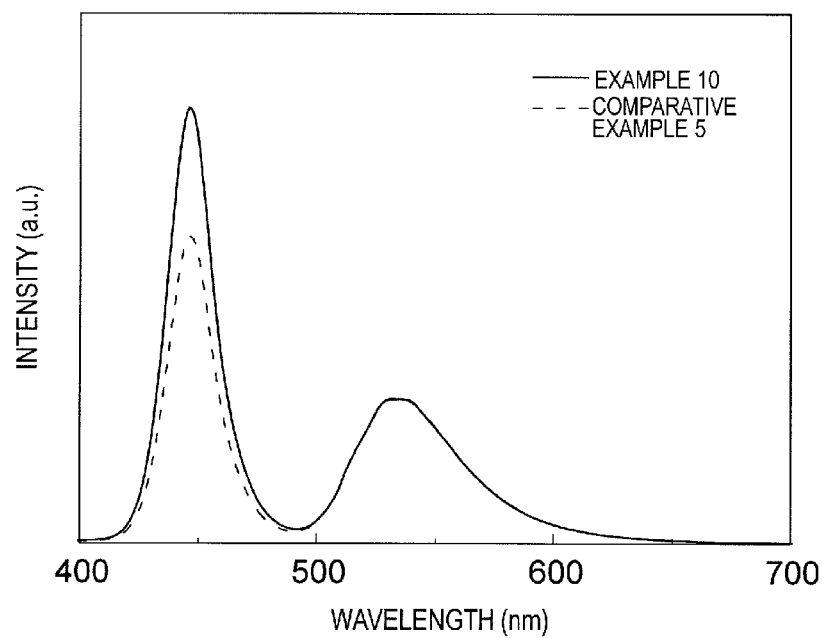
FIG. 24 is a graph showing the result of measurement of emission spectra of LED elements in Example 10 and Comparative Example 5, respectively.

FIG. 24 shows emission spectra of the LED elements of Example 10 and Comparative Example 5. As shown in FIG. 24, in Example 10, the inside of the first phosphor layer was able to be densely filled with zinc oxide columnar crystals in the c-axis orientation. Thus, light scattering in the wavelength conversion element was able to be inhibited more than in the case of Comparative Example 5, and excitation light from the LED chip was able to be taken outside of the LED element with efficiency.

Example 11

A plurality of semiconductor laser chips having a light emission wavelength of 446 nm and having the same light emission intensity were prepared. The first phosphor layer having a thickness of 16 μm and the second phosphor layer having a thickness of 1 μm were formed by a method similar to that used in Example 1. Note that, the weight per unit area of the phosphor was 3.3 mg/cm$^2$. As illustrated in FIG. 10, the wavelength conversion element was cut by dicing so as to conform to the size of the opening 104 in the cap 103 to prepare an individualized wavelength conversion element. Further, the semiconductor laser chip was attached to the block 102 using solder, and bonding wires were used to electrically connect the semiconductor laser chip 110 and the leads 105 provided on the stem 101. Then, the opening 104 and edges of the individualized wavelength conversion element were fixed with an adhesive so that the substrate side was the side of the surface 108 from which light from the semiconductor laser light emitting device is emitted to complete the semiconductor laser light emitting device illustrated in FIG. 10. The completed semiconductor laser light emitting device was attached to an integrating sphere and driven by a constant current of 30 mA. Thus, the light emission intensity of the entire radiant flux of the semiconductor laser light emitting device was measured. The result is shown in Table 5.

Comparative Example 6

By a method similar to that used in Comparative Example 1, a second phosphor layer having a thickness of 17 μm was formed. Note that, the weight per unit area of the phosphor was 3.3 mg/cm$^2$. After that, similarly to Example 11, semiconductor laser chips having a light emission wavelength of 446 nm and having the same light emission intensity were used to complete a semiconductor laser light emitting device, and the light emission intensity of the entire radiant flux of the semiconductor laser light emitting device was measured. The result is shown in Table 5.

Table 5 covers the result of the light emission intensities of the semiconductor laser light emitting devices of Example 11 and Comparative Example 6.

TABLE 5

| Sample | Structure | Thickness of first phosphor layer (μm) | Thickness of second phosphor layer (μm) | Ratio of first phosphor layer in phosphor layer (%) | Chromaticity x | Chromaticity y | Light emission intensity |
|---|---|---|---|---|---|---|---|
| Example 11 | First phosphor layer + second phosphor layer | 16 | 1 | 94.1 | 0.27 | 0.25 | 117 |
| Comparative Example 6 | Second phosphor layer only | 0 | 17 | 0 | 0.30 | 0.31 | 100 (reference) |

The weight per unit area of the phosphor was set equal in the two samples. The light emission intensity of the semiconductor laser light emitting device other than the semiconductor laser light emitting device of Comparative Example 6 is expressed supposing that the light emission intensity of the semiconductor laser light emitting device of Comparative Example 6 is 100.

In the semiconductor laser light emitting device of Comparative Example 6 having only the second phosphor layer filled with glass, chromaticity of (x=0.30, y=0.31) was obtained. In comparison with that, in the case of Example 11, even though the number of the kind of the phosphor was one and the amount of the phosphor was the same similarly to the case of Comparative Example 6, chromaticity of (x=0.27, y=0.25) was obtained. In this way, even though the same phosphor was used and the amount of the phosphor was the same, the ratio between blue light from the semiconductor laser chip and yellow light emitted from the phosphor can be changed, and thus, according to Example 11, a wavelength conversion element and a semiconductor laser light emitting device whose chromaticities were different from those of Comparative Example 6 were able to be realized.

The light emission intensity of Example 11 was 117, and the obtained light emission intensity was 1.17 times as high as that of the semiconductor laser light emitting device using the wavelength conversion element having only the second phosphor layer formed thereon. This is because the inside of the first phosphor layer was able to be densely filled with zinc oxide columnar crystals having only a small number of grain boundaries in the c-axis orientation. Therefore, light scattering in the wavelength conversion element was able to be inhibited.

Figure 25A:
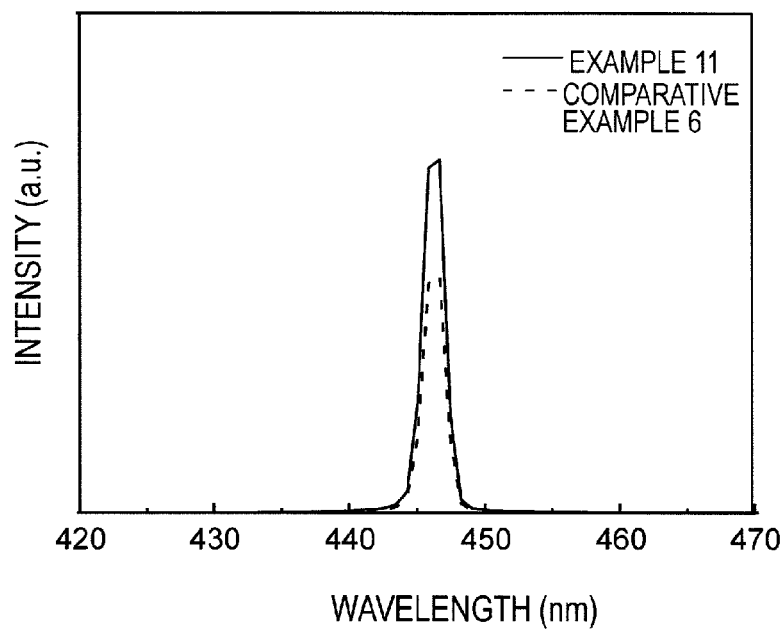
FIGS. 25A and 25B are graphs showing the result of measurement of emission spectra of semiconductor laser light emitting devices in Example 11 and Comparative Example 6, respectively.
Figure 25B:
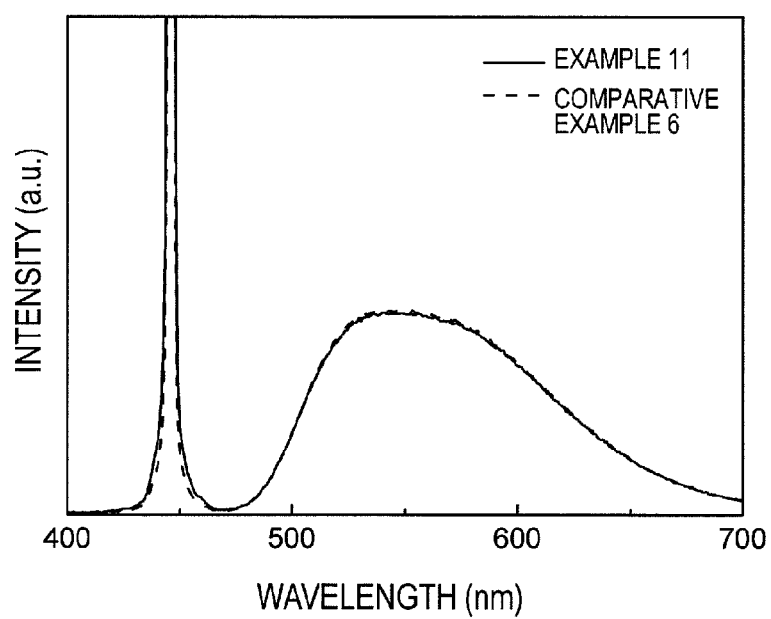

FIGS. 25A and 25B show emission spectra of the semiconductor laser light emitting devices of Example 11 and Comparative Example 6, respectively. FIG. 25A is an enlarged view around excitation light from the semiconductor laser chips, and FIG. 25B is an enlarged view around fluorescence excited by excitation light. As shown in FIGS. 25A and 25B, in Example 11, the inside of the first phosphor layer was able to be densely filled with zinc oxide columnar crystals in the c-axis orientation, and thus, light scattering in the wavelength conversion element was able to be inhibited more than in the case of Comparative Example 6, so that excitation light from the semiconductor laser chip was able to be taken outside of the semiconductor laser light emitting device with efficiency.

Example 12

The β-SiAlON:Eu phosphor having a refractive index of 1.9 and an average particle diameter of 6 μm was used to form the first phosphor layer having a thickness of 28 μm and the second phosphor layer having a thickness of 2 μm by a method similar to that used in Example 10. Note that, the weight per unit area of the phosphor was 5.0 mg/cm$^2$. Further, by a method similar to that used in Example 11, a semiconductor laser light emitting device was completed, and the light emission intensity of the entire radiant flux of the semiconductor laser light emitting device was measured. The result is shown in Table 6.

Comparative Example 7

The β-SiAlON:Eu phosphor having a refractive index of 1.9 and an average particle size of 6 μm was used to form a second phosphor layer having a thickness of 30 μm by a method similar to that used in Comparative Example 5. Note that, the weight per unit area of the phosphor was 5.0 mg/cm$^2$. After that, by a method similar to that used in Example 11, a semiconductor laser light emitting device was completed, and the light emission intensity of the entire radiant flux of the semiconductor laser light emitting device was measured. The result is shown in Table 6.

Table 6 covers the result of the light emission intensities of the semiconductor laser light emitting devices of Example 12 and Comparative Example 7.

TABLE 6

| Sample | Structure | Thickness of first phosphor layer (μm) | Thickness of second phosphor layer (μm) | Ratio of first phosphor layer in phosphor layer (%) | Chromaticity x | Chromaticity y | Light emission intensity |
|---|---|---|---|---|---|---|---|
| Example 12 | First phosphor layer + second phosphor layer | 28 | 2 | 93.3 | 0.21 | 0.21 | 137 |
| Comparative Example 7 | Second phosphor layer only | 0 | 30 | 0 | 0.24 | 0.35 | 100 (reference) |

The weight per unit area of the phosphor was set equal in the two samples. The light emission intensity of the semiconductor laser light emitting device other than the semiconductor laser light emitting device of Comparative Example 7 is expressed supposing that the light emission intensity of the semiconductor laser light emitting device of Comparative Example 7 is 100.

In the semiconductor laser light emitting device of Comparative Example 7 having only the second phosphor layer filled with glass, chromaticity of (x=0.24, y=0.35) was obtained. In comparison with that, in the case of Example 12, even though the number of the kind of the phosphor was one and the amount of the phosphor was the same similarly to the case of Comparative Example 7, chromaticity of (x=0.21, y=0.21) was obtained. In this way, even though the same phosphor was used and the amount of the phosphor was the same, the ratio between blue light from the semiconductor laser chip and fluorescence from the phosphor can be changed, and thus, according to Example 12, a wavelength conversion element and a semiconductor laser light emitting device whose chromaticities were different from those of Comparative Example 7 were able to be realized.

The light emission intensity of Example 12 was 137, and the obtained light emission intensity was 1.37 times as high as that of the semiconductor laser light emitting device of Comparative Example 7 using the wavelength conversion element having only the second phosphor layer formed thereon. This is because the inside of the first phosphor layer was able to be densely filled with zinc oxide columnar crystals having only a small number of grain boundaries in the c-axis orientation. Therefore, light scattering in the phosphor layer was able to be inhibited.

Figure 26A:
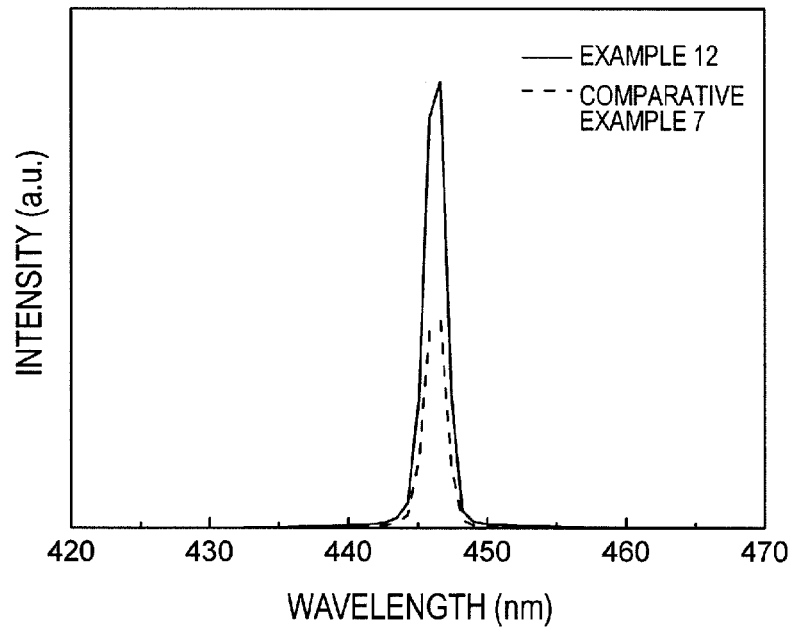
FIGS. 26A and 26B are graphs showing the result of measurement of emission spectra of semiconductor laser light emitting devices in Example 12 and Comparative Example 7.
Figure 26B:
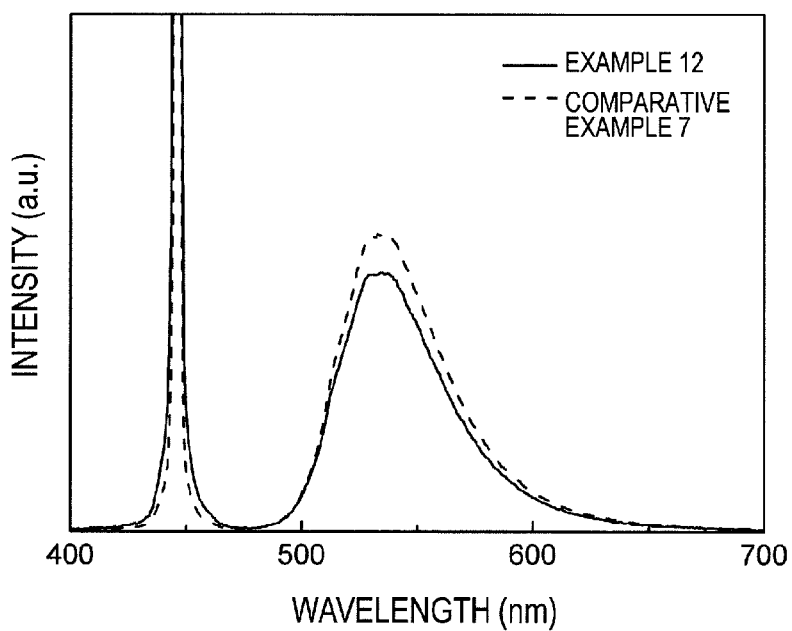

FIGS. 26A and 26B show emission spectra of the semiconductor laser light emitting devices of Example 12 and Comparative Example 7, respectively. FIG. 26A is an enlarged view around excitation light from the semiconductor laser chips, and FIG. 26B is an enlarged view around fluorescence excited by excitation light. As shown in FIGS. 26A and 26B, in Example 12, the inside of the first phosphor layer was able to be densely filled with zinc oxide columnar crystals in the c-axis orientation. Thus, light scattering in the wavelength conversion element was able to be inhibited more than in the case of Comparative Example 7, and excitation light from the semiconductor laser chip was able to be taken outside of the semiconductor laser light emitting device with efficiency.

(Evaluation of Transmittance of Zinc Oxide)

Figure 27:
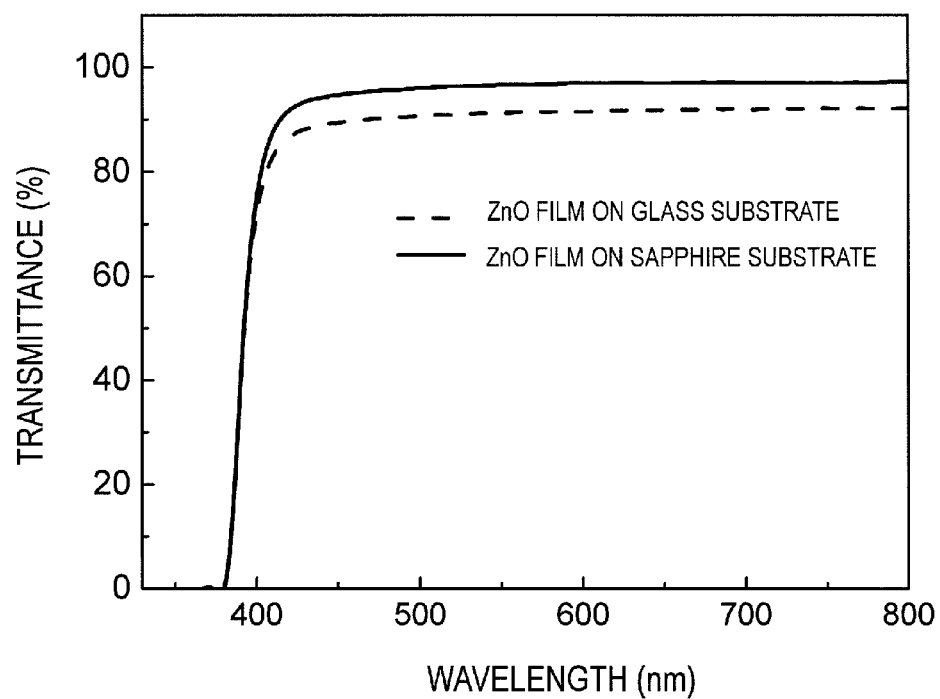
FIG. 27 is a graph showing the result of measurement of transmission spectra of zinc oxide films on a glass substrate and on a sapphire substrate, respectively.

On a glass substrate having the ZnO underlayer formed thereon, which was the same as that used in Example 1, the phosphor particle layer was not formed, and only a zinc oxide film was formed by crystal growth using solution growth which was similar to that used in Example 1. The thickness of the zinc oxide film was about 20 μm. The transmittance of the zinc oxide film was measured using, as a reference in a wavelength range of 330 nm to 800 nm, a glass substrate not having the zinc oxide film formed thereon. The ZnO underlayer was formed also on a sapphire substrate instead of the glass substrate by a method similar to that used in Example 1, and a zinc oxide film of about 20 μm was formed by solution growth which was similar to that used in Example 1. The transmittance of the zinc oxide film on the sapphire substrate was also measured similarly using a sapphire substrate as a reference. FIG. 27 shows transmittance spectra of zinc oxide films on a glass substrate and on a sapphire substrate, respectively. When the wavelength was 470 nm, the transmittance of the zinc oxide film on the glass substrate was 90%, and the transmittance of the zinc oxide film on the sapphire substrate was 95%. When the wavelength was 430 nm, the transmittance of the zinc oxide film on the glass substrate was 88%, and the transmittance of the zinc oxide film on the sapphire substrate was 94%. When the wavelength was 420 nm, the transmittance of the zinc oxide film on the glass substrate was 87%, and the transmittance of the zinc oxide film on the sapphire substrate was 92%. When the wavelength was 400 nm, the transmittance of the zinc oxide film on the glass substrate was 72%, and the transmittance of the zinc oxide film on the sapphire substrate was 75%.

The transmittance of the zinc oxide film formed by solution growth is significantly high, and the transmittance is 72% or more in the wavelength range of 400 nm to 420 nm of blue-violet light. Thus, even when the excitation light is blue-violet light, the wavelength conversion element according to this example can be excited. Further, in the wavelength range of 420 nm to 470 nm of blue light, the transmittance is 87% or more. Thus, wavelength conversion element according to this example can be excited more efficiently when the excitation light is blue light than when the excitation light is blue-violet light.

(Refractive Index Difference Between Phosphor and Matrix)

When a YAG phosphor having a refractive index of 1.8 was used as the phosphor, the refractive index difference (Δn1) between the phosphor and zinc oxide which form the first phosphor layer was 0.2, and the refractive index difference (Δn2) between the phosphor and glass which form the second phosphor layer was 0.35.

When a β-SiAlON phosphor having a refractive index of 1.9 was used as the phosphor, the refractive index difference (Δn1) between the phosphor and zinc oxide which form the first phosphor layer was 0.1, and the refractive index difference (Δn2) between the phosphor and glass which form the second phosphor layer was 0.45.

As the refractive index of the phosphor which is used becomes closer to that of zinc oxide, the difference (|Δn2−Δn1|) between the refractive index difference (Δn1) in the first phosphor layer and the refractive index difference (Δn2) in the second phosphor layer can be increased, and thus, the chromaticity adjustment ranges of the wavelength conversion element, the LED element, and the semiconductor laser light emitting element can be widened.

As can be understood from the above-mentioned examples of experiment, both adjusting the chromaticity and inhibiting light scattering can be attained in the wavelength conversion element which includes the first phosphor layer using zinc oxide having a high refractive index and the second phosphor layer using glass having a low refractive index, by, in the first phosphor layer using zinc oxide which has the high refractive index but is crystalline and has a low degree of freedom in shape, inhibiting a grain boundary and a void in the wavelength conversion element, and further, by controlling the ratio between the thickness of the first phosphor layer and the thickness of the second phosphor layer.

With regard to the first phosphor layer in which the spaces in the first phosphor layer were filled with zinc oxide columnar crystals in the c-axis orientation with the tilt of the c-axis being 4° or less, light scattering in the wavelength conversion element was inhibited, and the LED element using the wavelength conversion element attained easiness of adjusting the chromaticity and high light emission intensity.

Further, the first phosphor layer in which the spaces in the first phosphor particle layer were filled with single crystalline zinc oxide had no grain boundary, and light scattering in the wavelength conversion element was inhibited more than in the case of the first phosphor layer in which the spaces were filled with zinc oxide columnar crystals. The LED element using the wavelength conversion element attained high light emission intensity.

Further, the wavelength conversion element in which the spaces in the first phosphor layer were filled with zinc oxide columnar crystals in the c-axis orientation with the tilt of the c-axis being 4° or less inhibited light scattering therein, and, even though the same phosphor was used and the amount of the phosphor was the same, the semiconductor laser light emitting device according to this embodiment were able to realize different chromaticities. Further, the semiconductor laser light emitting device using the wavelength conversion element attained high light emission intensity.

Further, even when the β-SiAlON phosphor was used as the phosphor instead of the YAG phosphor, the wavelength conversion element in which the spaces in the first phosphor layer were filled with zinc oxide columnar crystals in the c-axis orientation with the tilt of the c-axis being 4° or less inhibited light scattering therein, and, even though the same phosphor was used and the amount of the phosphor was the same, the LED element and the semiconductor laser light emitting device according to this embodiment were able to realize different chromaticities. Further, the LED element and the semiconductor laser light emitting device using the wavelength conversion element attained high light emission intensity.

The wavelength conversion element, the LED element, and the semiconductor laser light emitting device disclosed in the present application are incorporated in lighting, a headlight (HD) for a vehicle, a daytime running light (DRL) for a vehicle, a display, or a projector.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A wavelength conversion element, comprising:
   a plurality of phosphor particles;
   a first matrix located among a part of the plurality of phosphor particles and formed of zinc oxide in a c-axis orientation or single crystalline zinc oxide; and
   a second matrix located among a remaining part of the plurality of phosphor particles and formed of a material having a refractive index that is lower than a refractive index of the zinc oxide.

2. The wavelength conversion element according to claim 1, wherein a full width at half maximum of a c-axis of the zinc oxide in a c-axis orientation or single crystalline zinc oxide using an X-ray rocking curve method is 4° or less.

3. The wavelength conversion element according to claim 1, comprising:
   a first phosphor layer comprising the part of the plurality of phosphor particles and the first matrix; and
   a second phosphor layer comprising the remaining part of the plurality of phosphor particles and the second matrix.

4. The wavelength conversion element according to claim 3, further comprising a thin film held in contact with the first phosphor layer and formed of zinc oxide.

5. The wavelength conversion element according to claim 4, further comprising a substrate held in contact with the thin film,
   wherein the thin film is located between the first phosphor layer and the substrate.

6. The wavelength conversion element according to claim 3, further comprising a substrate held in contact with the first phosphor layer.

7. The wavelength conversion element according to claim 5, wherein the substrate is formed of one selected from the group consisting of glass, quartz, silicon oxide, sapphire, gallium nitride, and zinc oxide.

8. The wavelength conversion element according to claim 1, wherein the zinc oxide is columnar crystals.

9. The wavelength conversion element according to claim 1, wherein the single crystalline zinc oxide is in the c-axis orientation.

10. The wavelength conversion element according to claim 1, wherein the plurality of phosphor particles comprise at least one selected from the group consisting of a yttrium aluminum garnet (YAG) phosphor and β-SiAlON.

11. The wavelength conversion element according to claim 1, wherein the second matrix comprises at least one selected from the group consisting of a high temperature sintered glass, a low temperature sintered glass, silicon dioxide, a liquid glass, an inorganic-organic complex, a silicone rubber-based highly heat-resistant light-transmitting resin, and a silicone resin.

12. The wavelength conversion element according to claim 1, wherein the plurality of phosphor particles are adjacent to one another and the first matrix and the second matrix are held in contact with each other.

13. An LED element, comprising:
    a semiconductor light emitting element for emitting excitation light; and
    the wavelength conversion element according to claim 1 into which the excitation light emitted from the semiconductor light emitting element enters.

14. The LED element according to claim 13, further comprising a crystal separation layer located between the wavelength conversion element and the semiconductor light emitting element.

15. The LED element according to claim 14, wherein the crystal separation layer is formed of an amorphous material containing silicon dioxide as a main component.

16. The LED element according to claim 15, wherein the crystal separation layer is formed by plasma-enhanced chemical vapor deposition.

17. A semiconductor laser light emitting device, comprising:
    a semiconductor laser chip for emitting excitation light; and
    the wavelength conversion element according to claim 1 into which the excitation light emitted from the semiconductor laser chip enters.

18. The semiconductor laser light emitting device according to claim 17, wherein the excitation light is light in a wavelength band of blue or blue-violet.

19. The semiconductor laser light emitting device according to claim 18, wherein:
    the plurality of phosphor particles comprise a blue phosphor and a yellow phosphor;
    the excitation light is the light in the wavelength band of blue-violet; and
    the blue phosphor emits blue light by exciting the blue phosphor by the excitation light, and the yellow phosphor emits yellow light by exciting the yellow phosphor by the excitation light or the blue light.

20. A vehicle, comprising:
    the semiconductor laser light emitting device according to claim 17; and
    a power supply for supplying electric power to the semiconductor laser light emitting device.

* * * * *